US008194436B2

(12) United States Patent
Fukami et al.

(10) Patent No.: US 8,194,436 B2
(45) Date of Patent: Jun. 5, 2012

(54) MAGNETIC RANDOM ACCESS MEMORY, WRITE METHOD THEREFOR, AND MAGNETORESISTANCE EFFECT ELEMENT

(75) Inventors: Shunsuke Fukami, Tokyo (JP);
Tetsuhiro Suzuki, Tokyo (JP);
Kiyokazu Nagahara, Tokyo (JP);
Norikazu Ohshima, Tokyo (JP);
Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 251 days.

(21) Appl. No.: 12/678,538

(22) PCT Filed: Jul. 7, 2008

(86) PCT No.: PCT/JP2008/062296
§ 371 (c)(1),
(2), (4) Date: Mar. 17, 2010

(87) PCT Pub. No.: WO2009/037910
PCT Pub. Date: Mar. 26, 2009

(65) Prior Publication Data
US 2010/0214826 A1  Aug. 26, 2010

(30) Foreign Application Priority Data

Sep. 19, 2007 (JP) ................... 2007-242203

(51) Int. Cl.
*G11C 11/00* (2006.01)
*G11C 11/14* (2006.01)
*G11C 11/15* (2006.01)

(52) U.S. Cl. .................. 365/157; 365/171; 365/173

(58) Field of Classification Search .............. 365/158
See application file for complete search history.

(56) References Cited

U.S. PATENT DOCUMENTS

| 5,640,343 | A | 6/1997 | Gallagher et al. |
| 6,055,179 | A | 4/2000 | Koganei et al. |
| 6,545,906 | B1 | 4/2003 | Savtchenko et al. |
| 6,834,005 | B1 | 12/2004 | Parkin |
| 6,985,385 | B2 * | 1/2006 | Nguyen et al. ............ 365/173 |

(Continued)

FOREIGN PATENT DOCUMENTS

JP        2001257395 A    9/2001

(Continued)

OTHER PUBLICATIONS

International Search Report for PCT/JP2008/062296, mailed Sep. 9, 2008. N. Sakimura et al., "MRAM Cell Technology for over 500MHz SoC", 2006 Symposium on VLSI Circuit, Digest of Technical Papers, p. 136.

(Continued)

*Primary Examiner* — Son Mai

(57) ABSTRACT

A magnetic random access memory includes: a first ferromagnetic layer; an insulating layer provided adjacent to the first ferromagnetic layer; and a first magnetization pinned layer provided adjacent to the insulating layer on a side opposite to the first ferromagnetic layer. The first ferromagnetic layer includes a magnetization free region, a first magnetization pinned region, and a second magnetization pinned region. The magnetization free region has reversible magnetization, and overlaps with the second ferromagnetic layer. The first magnetization pinned region has first pinned magnetization, and is connected to a part of the magnetization free region. The second magnetization pinned region has second pinned magnetization, and is connected to a part of the magnetization free region. The first ferromagnetic layer has magnetic anisotropy in a direction perpendicular to a film surface. The first pinned magnetization and the second pinned magnetization are pinned antiparallel to each other in the direction perpendicular to the film surface.

17 Claims, 31 Drawing Sheets

U.S. PATENT DOCUMENTS

| | | | |
|---|---|---|---|
| 7,532,502 B2 | 5/2009 | Saito | |
| 7,764,538 B2 * | 7/2010 | Ito | 365/158 |
| 7,869,266 B2 | 1/2011 | Ranjan et al. | |
| 7,989,223 B2 * | 8/2011 | Inomata et al. | 438/3 |
| 8,064,245 B2 * | 11/2011 | Prejbeanu | 365/158 |
| 2002/0167059 A1 | 11/2002 | Nishimura et al. | |
| 2006/0237808 A1 | 10/2006 | Saito | |
| 2010/0188890 A1 * | 7/2010 | Fukami et al. | 365/158 |
| 2011/0002163 A1 * | 1/2011 | Fukami et al. | 365/173 |
| 2011/0199818 A1 * | 8/2011 | Fukami et al. | 365/171 |
| 2011/0298067 A1 | 12/2011 | Ishiwata et al. | |

FOREIGN PATENT DOCUMENTS

| | | |
|---|---|---|
| JP | 2003045010 A | 2/2003 |
| JP | 2003110094 A | 4/2003 |
| JP | 2004179183 A | 6/2004 |
| JP | 2005505889 A | 2/2005 |
| JP | 2005093488 A | 4/2005 |
| JP | 2005123617 A | 5/2005 |
| JP | 2005-150303 A | 6/2005 |
| JP | 2005-191032 A | 7/2005 |
| JP | 2005236250 A | 9/2005 |
| JP | 2006-504210 A | 2/2006 |
| JP | 2006-073930 A | 3/2006 |
| JP | 2006093578 A | 4/2006 |
| JP | 2006-270069 A | 10/2006 |
| JP | 2006287081 A | 10/2006 |
| JP | 2007103663 A | 4/2007 |
| JP | 2007258460 A | 10/2007 |
| JP | 2007317895 A | 12/2007 |
| WO | 2005069368 A | 7/2005 |
| WO | 2006046591 A | 5/2006 |
| WO | 2007/020823 A | 2/2007 |

OTHER PUBLICATIONS

A. Yamaguchi et al., "Real-Space Observation of Current-Driven Domain Wall Motion in Submicron Magnetic Wires", Physical Review Letters, vol. 92, No. 7, Feb. 20, 2004, pp. 077205-1-077205-4.

A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

A. Thiaville et al., "Micromagnetic understanding of current-driven domain wall motion in patterned nanowires", Europhysics Letters, vol. 69, pp. 990-996 (2005).

S. Imada et al., "Perpendicular magnetization of L1o-ordered FePt films in the thinnest limit", Applied Physics Letters 90, 132507-1-132507-3 (2007).

C. Platt et al., "Structural and magnetic properties of CoCrPt perpendicular media grown on different buffer layers", Journal of Magnetism and Magnetic Materials, 247 (2002), 153-158.

J.C. Slonczewski, "Current-driven excitation of magnetic multilayers", Journal of Magnetism & Magnetic Materials, 159, L1-L7, 1996.

D.D. Djayaprawira et al., "230% room-temperature magnetaresistance in CoFeB/MgO/CoFeB magnetic tunnel junctions", Applied Physics Letters, vol. 86, 092502, 2005.

D. Ravelosona et al., "Threshold currents to move domain walls in films with perpendicular anisotropy", Applied Physics Letters, vol. 90, 072508, 2007.

H. Numata et al., "Magnetic Configuration of A New Memory Cell Utilizing Domain Wall Motion", Intermag 2006 Digest, HQ-03, 2006, p. 933.

US Office Action for U.S. Appl. No. 12/665,773 dated Mar. 8, 2012.

* cited by examiner

MAGNETIC RANDOM ACCESS MEMORY, WRITE METHOD THEREFOR, AND MAGNETORESISTANCE EFFECT ELEMENT

This application is the National Phase of PCT/JP2008/062296, filed on Jul. 7, 2008, which is based upon and claims the benefit of priority from Japanese patent application No. 2007-242203 filed on Sep. 19, 2007, the disclosure of which is incorporated herein in its entirety by reference.

TECHNICAL FIELD

The present invention relates to a magnetic random access memory, a write method thereof, and a magnetoresistance effect element. More particularly, the present invention relates to a magnetic random access memory of a domain wall motion system, a write method thereof, and a magnetoresistance effect element.

BACKGROUND ART

The magnetic random access memory (MRAM) is expected to serve as a nonvolatile memory that can operate at high speed and is rewritable an infinite number of times, and therefore intensively developed. In the MRAM, a magnetic material is used as a memory element, and information is memorized corresponding to a direction of magnetization of the magnetic material. As a method for switching the magnetization of the magnetic material, there are proposed several methods; however, they are common in that any of them uses electric current. To put the MRAM into practical use, reducing a write current is very important. For example, according to N. Sakimura, et al., "MRAM Cell Technology for Over 500 MHz SoC", 2006 Symposium On VLSI Circuits, Digest of Technical Papers, pp. 136, 2006, the write current is required to be reduced to 0.5 mA or less, and more preferably to 0.2 mA or less.

Among methods for writing information to the MRAM, the most popular one is a method that switches a magnetization direction of a magnetic memory element with a magnetic field generated by current flowing through a write line arranged around the magnetic memory element. This method enables writing at 1 nanosecond or less in principle because of magnetization switching by the magnetic field, and is therefore preferable to achieve a high speed MRAM. However, a magnetic field for switching magnetization of a magnetic material that ensures thermal stability and disturbance magnetic field resistance is typically around a few 10s Oe (oersted). To generate such a magnetic field, a current of around a few mA is required. In such a case, a chip area is inevitably increased, and a power consumption required for writing is also increased. For this reason, such MRAM is less competitiveness as compared with the other random access memories. In addition to this, as the element is miniaturized, the write current further increases, which is not preferable also from the perspective of scaling.

In recent years, as means adapted to solve such problems, the following two methods are proposed. A first method is a method using spin injection magnetization switching. This is a method that, in a stacked film including a first magnetic layer having reversible magnetization and a second magnetic layer electrically connected to the first magnetic layer and having pinned magnetization, when the current flows between the first and second magnetic layers, uses an interaction between spin-polarized conduction electrons and localized electrons in the first magnetic layer to switch the magnetization of the first magnetic layer. The spin injection magnetization switching occurs at a certain current density or more. Therefore, as an element size is decreased, a current required for writing is reduced. That is, it can be said that the spin injection magnetization switching method is superior in the scaling property. However, in general, an insulating layer is provided between the first and second magnetic layers, and upon writing, a relatively large current should flow through the insulating layer, which causes a problem in write disturbance resistance or reliability. Also, since a write current path and a read current path are the same, erroneous writing upon reading is also concerned. As described, the spin injection magnetization switching is superior in the scaling property, but has some barriers for practical application.

On the other hand, a second method is a magnetization switching method using a current-driven domain wall motion phenomenon. The magnetization switching method can solve the above-described problems associated with the spin injection magnetization switching. An MRAM using the current-driven domain wall motion phenomenon is disclosed in, for example, Japanese Patent Publication JP 2005-191032 A. In the MRAM using the current-driven domain wall phenomenon, magnetizations at both end parts of a first magnetization layer having reversible magnetization are pinned so as to be substantially antiparallel to each other. In such magnetization arrangement, a domain wall is introduced into the first magnetization layer.

Note that, as reported in A. Yamaguchi et al., "Real-Space Observation of Current-Driven Domain Wall Motion in Submicron Magnetic Wires", Physical Review Letters, vol. 92, No. 7, pp. 077205 (2004), if a current is made to flow in a direction in which the current passes through a domain wall, the domain wall moves toward a direction of conduction electrons. Based on this, by making the current flow through the first magnetic layer, it is possible to write information. The current-driven domain wall motion also occurs at a certain current density or more, and therefore it can be said that the current-driven domain wall motion has the scaling property similarly to the spin injection magnetization switching. In addition to this, in the MRAM using the current-driven domain wall motion phenomenon, a write current does not flow through an insulating layer, and a write current path and a read current path are separated. For this reason, the above problems as described in the spin injection magnetization switching can be solved.

As a related technique, Japanese Patent Publication JP 2005-150303 A discloses a magnetoresistance effect element and a magnetic memory. The magnetoresistance effect element includes a ferromagnetic tunnel junction including a three-layered structure of a first ferromagnetic layer/a tunnel barrier layer/a second ferromagnetic layer. The first ferromagnetic layer has a larger coercive force than the second ferromagnetic layer, and a tunnel conductance is varied depending on a relative angle between magnetizations of the two ferromagnetic layers. In the magnetoresistance effect element, magnetization of an end part of the second ferromagnetic layer is pinned in a direction having a component orthogonal to an easy magnetization axis of the second ferromagnetic layer.

Japanese Patent Publication JP 2006-73930 A discloses a varying method of a magnetization state of a magnetoresistance effect element using domain wall motion, a magnetic memory element using the method, and a solid magnetic memory. The magnetic memory device includes a first magnetic layer, an interlayer, and a second magnetic layer. Information is recorded on the basis of magnetization directions of the first and second magnetic layers. The magnetic memory element regularly forms: in at least one of the magnetic layers, domains of which magnetizations are antiparallel to each other; and a domain wall that separates between the domains. Then, by moving the domain wall in the magnetic layer, locations of the adjacent domains are controlled to record the information.

Japanese Patent Publication JP 2006-270069 A (WO2006090626) discloses a magnetoresistance effect element and a high-speed magnetic recording device based on domain wall motion by a pulse current. The magnetoresistance effect element includes a first magnetization pinned layer/a magnetization free layer/a second magnetization pinned layer. The magnetoresistance effect element is provided with a mechanism for inducing a domain wall in a transition region between the magnetization pinned layer and the magnetization free layer, which serves as at least one of boundaries between the first magnetization pinned layer and the magnetization free layer and between the magnetization free layer and the second magnetization pinned layer. Also, directions of magnetizations of the magnetization pinned layers are set to be antiparallel to each other to make a structure having the domain wall in any one of the transition regions between the magnetization pinned layers and the magnetization free layer. By applying a current having a predetermined pulse width, the domain wall moves between the two transition regions with the current not exceeding a DC current density of $10^6$ A/cm$^2$, and thereby magnetization of the magnetization free layer is switched to detect a magnetoresistance associated with a variation in direction of relative magnetization.

However, the inventor has found the following problems. In the MRAM using the current-driven domain wall motion, there is a problem that an absolute value of a write current becomes relatively large. Besides the above Physical Review Letters, vol. 92, a large number of reports on the observation of current-induced domain wall motion are made, in which a current density of approximately $1\times10^8$ [A/cm$^2$] is required for domain wall motion. In such a case, if a width and a film thickness of a layer in which the domain wall motion occurs are respectively assumed to be 100 nm and 10 nm, the write current is 1 mA. To reduce the write current down to this value or less, it is only necessary to decrease the film thickness. However, it is reported that as the film thickness is decreased, the current density necessary for writing is further increased (see, for example, A. Yamaguchi, et al., "Reduction of Threshold Current Density for Current-Driven Domain Wall Motion using Shape Control", Japanese Journal of Applied Physics, vol. 45, No. 5A, pp. 3850-3853, (2006)). Also, reducing a narrow line width to a few 10s nm or less involves a large difficulty in fabrication technique. Further, in the case of using the current density close to $1\times10^8$ [A/cm$^2$] for writing, influences of electron migration and temperature rise are concerned.

In addition to this, in the MRAMs using the current-driven domain wall motion, including the MRAM disclosed in JP 2005-191032 A, a current is used to move the domain wall between two pinning sites. In this case, the following write error is concerned. That is, the concerned case is the case where the domain wall starting from a pinning site serving as a starting point does not reach a pinning site serving as a reaching point, the case where the domain wall starting from the pinning site serving as the starting point moves beyond the pinning site serving as the reaching point, the case where the domain wall starting from the pinning site serving as the starting point reaches the pinning site serving as the reaching point, but when the write current is switched off, the reached domain wall further moves to the other stable point, or the like.

DISCLOSURE OF INVENTION

An object of the present invention is to provide an MRAM and a write method for the MRAM in which a write error is unlikely to occur while a write current and a current density being sufficiently reduced, in the MRAM using a current-driven domain wall motion phenomenon.

A magnetic random access memory of the present invention includes: a first ferromagnetic layer; an insulating layer provided adjacent to the first ferromagnetic layer; and a first magnetization pinned layer provided adjacent to the insulating layer on a side opposite to the first ferromagnetic layer. The first ferromagnetic layer includes a magnetization free region, a first magnetization pinned region, and a second magnetization pinned region. The magnetization free region has reversible magnetization, and overlaps with the second ferromagnetic layer. The first magnetization pinned region has first pinned magnetization, and is connected to a part of the magnetization free region. The second magnetization pinned region has second pinned magnetization, and is connected to a part of the magnetization free region. The first ferromagnetic layer has magnetic anisotropy in a direction perpendicular to a film surface. The first pinned magnetization and the second pinned magnetization are pinned antiparallel to each other in the direction perpendicular to the film surface.

In a data write method for a magnetic random access memory of the present invention, the magnetic random access memory includes: a first ferromagnetic layer; an insulating layer provided adjacent to the first ferromagnetic layer; and a first magnetization pinned layer provided adjacent to the insulating layer on a side opposite to the first ferromagnetic layer. The first ferromagnetic layer includes: a magnetization free region having reversible magnetization and overlaps with the second ferromagnetic layer; a first magnetization pinned region having first pinned magnetization and is connected to a part of the magnetization free region; and a second magnetization pinned region having second pinned magnetization and is connected to a part of the magnetization free region. The first ferromagnetic layer has magnetic anisotropy in a direction perpendicular to a film surface. The first pinned magnetization and the second pinned magnetization are pinned antiparallel to each other in the direction perpendicular to the film surface. A data write method for a magnetic random access memory includes: (A) when writing of first data, supplying a first write current from the magnetization free region to the first magnetization pinned region; and (B) when writing of second data, supplying a second write current from the magnetization free region to the second magnetization pinned region.

A magnetoresistance effect element of the present invention includes: a first ferromagnetic layer; an insulating layer provided adjacent to the first ferromagnetic layer; and a first magnetization pinned layer provided adjacent to the insulating layer on a side opposite to the first ferromagnetic layer. The first ferromagnetic layer includes: a magnetization free region having reversible magnetization and overlaps with the second ferromagnetic layer; a first magnetization pinned region having first pinned magnetization and is connected to a part of the magnetization free region; and a second magnetization pinned region having second pinned magnetization and is connected to a part of the magnetization free region. The first ferromagnetic layer has magnetic anisotropy in a direction perpendicular to a film surface. The first fixed magnetization and the second fixed magnetization are pinned antiparallel to each other in the direction perpendicular to the film surface.

BRIEF DESCRIPTION OF DRAWINGS

The above and other objects and features of the present invention will be more obvious from the following exemplary embodiment described in conjunction with the accompanying drawings, in which.

BEST MODE FOR CARRYING OUT THE INVENTION

An exemplary embodiment of a magnetic random access memory of the present invention will be described below referring to the accompanying drawings. The magnetic random access memory of the present exemplary embodiment includes a plurality of magnetic memory cells arranged in an array, and each of the magnetic memory cells includes a magnetoresistance effect element.

(Configuration of Magnetic Memory Cell)

Figure 1A:
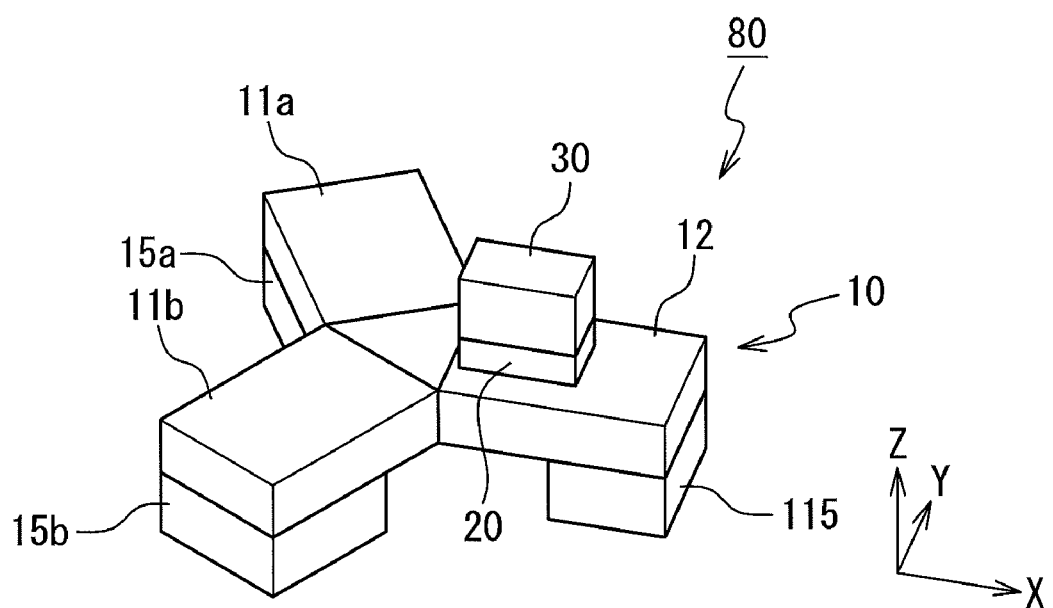
FIG. 1A is a perspective view schematically illustrating a structure of a magnetoresistance effect element according to an exemplary embodiment of the present invention.
Figure 1B:
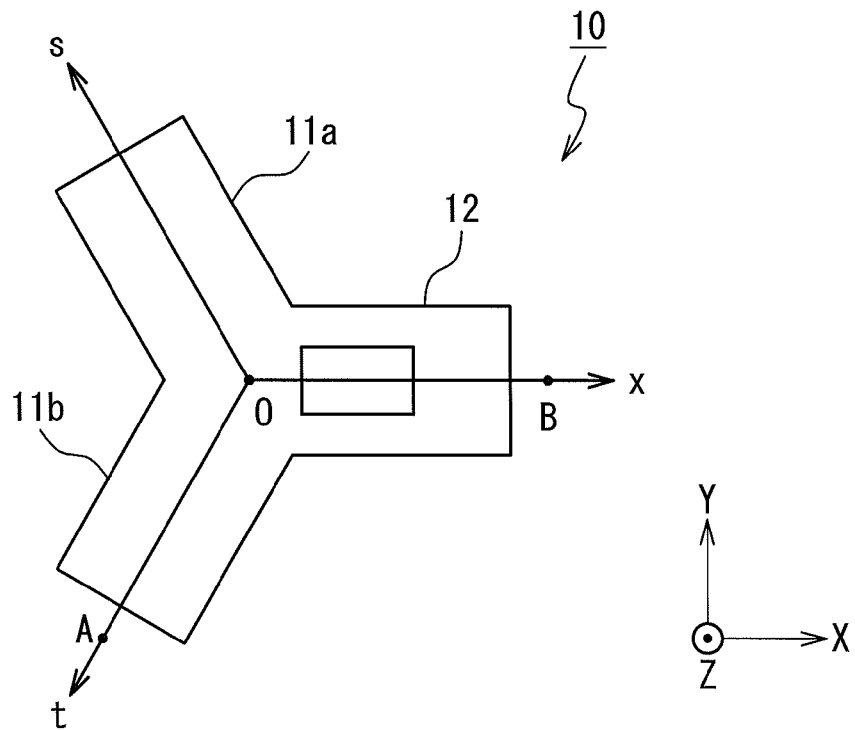
FIG. 1B is a plan view schematically illustrating the structure of the magnetoresistance effect element according to the exemplary embodiment of the present invention.
Figure 1C:
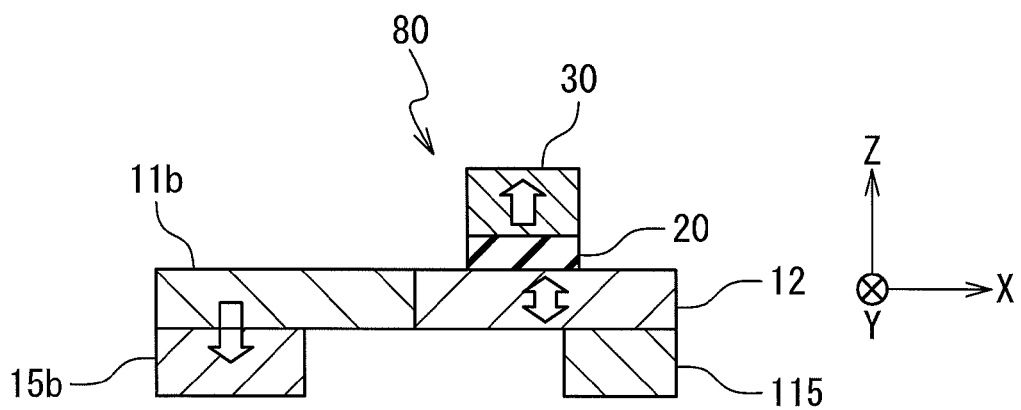
FIG. 1C is a cross-sectional view schematically illustrating the structure of the magnetoresistance effect element according to the exemplary embodiment of the present invention.

FIGS. 1A, 1B, and 1C are respectively a perspective view, a plan view, and a cross-sectional view schematically illustrating a structure of the magnetoresistance effect element according to the exemplary embodiment of the present invention. Note that FIG. 1C is an A-O-B cross-sectional view in FIG. 1B. The magnetoresistance effect element 80 according to the present invention includes: a first ferromagnetic layer 10, an insulating layer 20 provided adjacent to the first ferromagnetic layer 10; and a second ferromagnetic layer 20 provided adjacent to the insulating layer 20 on a side opposite to the first ferromagnetic layer 10. Preferably, the first ferromagnetic layer 10 is adjacently provided with a third ferromagnetic layer 15 and an electrode layer 115. Note that the third ferromagnetic layer 15 may be omitted. Also, in the case of providing the third ferromagnetic layer 15, the third ferromagnetic layer 15 and the first ferromagnetic layer 10 are only required to be in magnetic contact with each other. The insulating layer 20 is sandwiched between the first ferromagnetic layer 10 and the second ferromagnetic layer 30. The first ferromagnetic layer 10, the insulating layer 20, and the second ferromagnetic layer 30 form a magnetic tunnel junction (MTJ).

Also, as illustrated in FIG. 1B, the first ferromagnetic layer 10 in the magnetoresistance effect element 80 according to the present invention includes a first magnetization pinned region 11a, a second magnetization pinned region 11b, and a magnetization free region 12, which are three different regions. Magnetizations of the first magnetization pinned region 11a and the second magnetization pinned region 11b are respectively pinned in predetermined directions. On the other hand, magnetization of the magnetization free region 12 is reversible. The magnetization free region 12 having the reversible magnetization is formed so as to overlap with the second ferromagnetic layer 30. In other words, the magnetization free region 12 of the first ferromagnetic layer 10 is connected to the second ferromagnetic layer 30 through the insulating layer 20.

The first magnetization pinned region 11a and the second magnetization pinned region 11b are both connected to parts of the magnetization free region 12. Preferably, the first magnetization pinned region 11a and the second magnetization pinned region 11b are both connected to the same end part (one end) of end parts of the magnetization free region 12. That is, preferably, the first magnetization pinned region 11a, the second magnetization pinned region 11b, and the magnetization free region 12 has a "junction of three roads" shape.

More preferably, the first magnetization pinned region 11a, the second magnetization pinned region 11b, and the magnetization free region 12 are formed on the same plane (xy-plane). A shape and magnetization directions of the first ferromagnetic layer 10 on the xy-plane are respectively illustrated in FIGS. 1B and 1C. In FIG. 1B, the magnetization free region 12 is formed along an x-direction. Also, the first magnetization pinned region 11a is formed along an s-direction in the xy-plane. Further, the second magnetization pinned region 11b is formed along a t-direction in the xy-plane.

Also, as illustrated in FIG. 1C, a direction of magnetization of the second ferromagnetic layer 30 is assumed to be fixed substantially parallel to a +z direction. Note that the direction of the magnetization of the second ferromagnetic layer 30 may be substantially parallel to a −z direction. On the other hand, a direction of the magnetization of the magnetization free region 12 overlapping with the second ferromagnetic layer 30 is reversible, and therefore substantially parallel to the +z direction or the −z direction. That is, the magnetization of the magnetization free region 12 is allowed to be substantially parallel or antiparallel to the magnetization of the second ferromagnetic layer 30. Also, the magnetization of the first magnetization pinned region 11a is pinned substantially parallel to the +z direction (not illustrated in FIG. 1C). On the other hand, the magnetization of the second magnetization pinned region 11b is pinned in a direction substantially antiparallel to the magnetization of the first magnetization pinned region 11a, i.e., pinned substantially parallel to the −z direction. Note that the magnetization of the first magnetization pinned region 11a may be pinned substantially parallel to the −z direction, and the magnetization of the second magnetization pinned region 11b may be pinned substantially parallel to the +z direction, respectively.

In the magnetization arrangement as described above, one domain wall is introduced into the first ferromagnetic layer 10. For example, in the case where the magnetizations of the first magnetization pinned region 11a, the second magnetization pinned region 11b, and the magnetization free region 12 are respectively in the +z direction, −z direction, and +z direction, the domain wall is introduced at a boundary between the magnetization free region 12 and the second magnetization pinned region 11b. On the other hand, in the case where the magnetizations of the first magnetization pinned region 11a, the second magnetization pinned region 11b, and the magnetization free region 12 are respectively in the +z direction, −z direction, and −z direction, the domain wall is introduced at a boundary between the magnetization free region 12 and the first magnetization pinned region 11a. In the magnetoresistance effect element 80 according to the present invention, information is memorized corresponding to a direction of the magnetization of the magnetization free region 12. Accordingly, a position of the domain wall corresponds to the memorized information.

Note that, in the diagrams, the electrode layer 115 is a current or voltage supply terminal connected to the magnetization free region 12. Although not illustrated, electrode layers are also provided in end parts of the first magnetization pinned region 11a and the second magnetization pinned region 11b on sides opposite to the magnetization free region 12.

(Writing Method)

Figure 2:
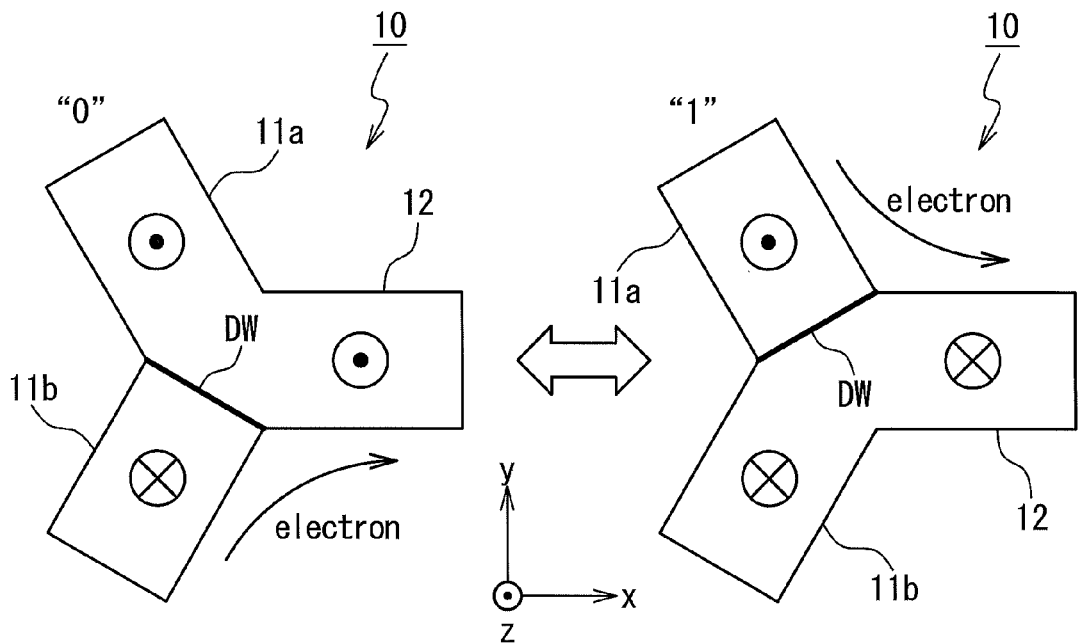
FIG. 2 is a conceptual diagram illustrating a method for writing information to the magnetoresistance effect element according to the exemplary embodiment of the present invention.

Next, a method for writing information to the magnetoresistance effect element 80 according to the present invention is described. FIG. 2 is a conceptual diagram illustrating the method for writing information to the magnetoresistance effect element, according to the exemplary embodiment of the present invention. In the magnetoresistance effect element 80 according to the present invention, information is written by moving the domain wall. As means adapted to move the domain wall, a current-induced domain wall motion phenomenon appearing when a current flows through the first ferromagnetic layer 10 is used. As illustrated in FIG. 2, the magnetizations of the first magnetization pinned region 11a and the second magnetization pinned region 11b are pinned in the +z and −z directions, respectively. In a state where information "0" is memorized (hereinafter referred to as a "0" state, which is illustrated in the left-hand side diagram), the magnetization of the magnetization free region 12 is assumed to be oriented in the +z direction. On the other hand, in a state where information "1" is memorized (hereinafter referred to as a "1" state, which is illustrated in the right-hand side diagram), the magnetization of the magnetization free region 12 is assumed to be oriented in the −z direction.

When "1" is written in the "0" state (left-hand side diagram of FIG. 2), a current is supplied from the magnetization free region 12 to the second magnetization pinned region 11b so that conduction electrons flows from the second magnetization pinned region 11b toward the magnetization free region 12. At this time, the domain wall present at the boundary between the second magnetization pinned region 11b and the magnetization free region 12 in the "0" state receives spin transfer torque from the conduction electrons; moves in the same direction as the conduction electrons; and passes through an end part (the other end) of the magnetization free region 12, which is not connected to the first or second magnetization pinned region 11a or 11b. This state corresponds to the "1" state (right-hand side diagram of FIG. 2). Thus, the "1" writing from the "0" state is performed.

Also, when "0" is written in the "1" state (right-hand side diagram of FIG. 2), a current is supplied from the magnetization free region 12 to the first magnetization pinned region 11a so that conduction electrons flows from the first magnetization pinned region 11a toward the magnetization free region 12. At this time, the domain wall present at the boundary between the first magnetization pinned region 11a and the magnetization free region 12 in the "1" state receives spin transfer torque from the conduction electrons; moves in the same direction as the conduction electrons; and passes through the end part (the other end) of the magnetization free region 12, which is not connected to the first or second magnetization pinned region 11a or 11b. This state corresponds to the "0" state (left-hand side diagram of FIG. 2). Thus, the "0" writing from the "1" state is performed.

As described, by the current flowing between the first magnetization pinned region 11a and the magnetization free region 12, or between the second magnetization pinned region 11b and the magnetization free region 12, rewriting between the "0" state and the "1" state can be performed.

Also, in the magnetoresistance effect element 80 according to the present invention, information can also be overwritten, i.e., the "0" writing from the "0" state, and the "1" writing from the "1" state can also be performed. For example, in the "0" state in a left-hand side diagram of FIG. 2, the current is supplied between the first magnetization pinned region 11a and the magnetization free region 12, which corresponds to the "0" writing. At this time, there is no domain wall in a corresponding current path, and therefore the domain wall does not move and the information is not rewritten. Accordingly, the "0" state is preserved as is. The "1" writing from the "1" state is also possible in the same manner.

(Reading Method)

Figure 3:
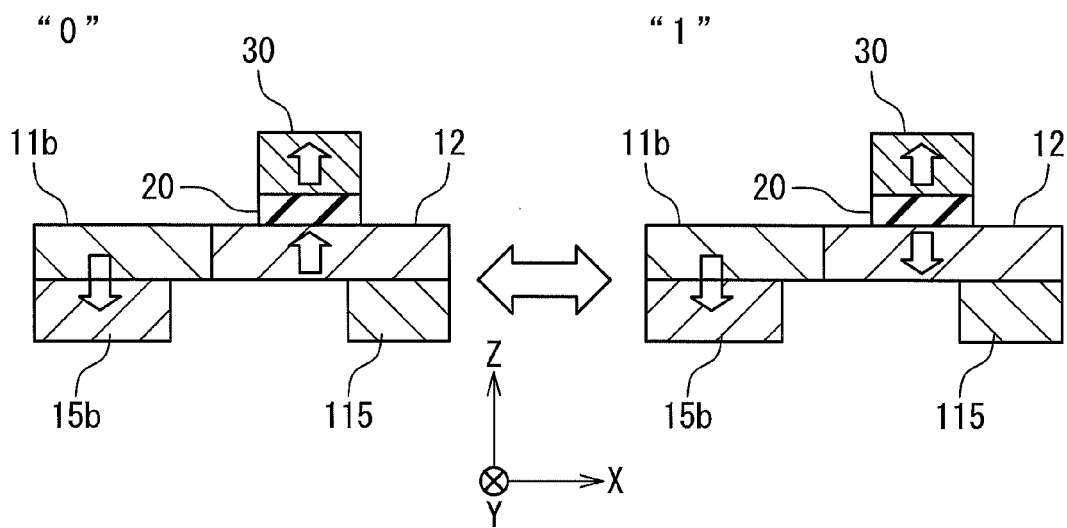
FIG. 3 is a conceptual diagram illustrating a method for reading information from the magnetoresistance effect element according to the exemplary embodiment of the present invention.

Next, a method for reading information from the magnetoresistance effect element 80 according to the present invention is described. FIG. 3 is a conceptual diagram illustrating the method for reading information from the magnetoresistance effect element, according to the exemplary embodiment of the present invention. As has been described, in the present invention, information is memorized on the basis of the magnetization direction of the magnetization free region 12, which is connected to the second ferromagnetic layer 30 through the insulating layer 20. In the magnetoresistance effect element 80 according to the present invention, to read information, a magnetoresistance effect is used.

Accordingly, in the case of FIG. 3, by a current flowing between the first ferromagnetic layer 10 and the second ferromagnetic layer 30 connected to the first ferromagnetic layer 10 through the insulating layer 20, a memory state can be read. For example, as in a left-hand side diagram of FIG. 3, when a magnetization direction of the magnetization free region 12 in the first ferromagnetic layer 10 and a magnetization direction of the second ferromagnetic layer 30 are parallel to each other, a low resistance state is achieved. On the other hand, as in the right-hand side diagram of FIG. 3, when the magnetization direction of the magnetization free region 12 and the magnetization direction of the second ferromagnetic layer 30 are antiparallel to each other, a high resistance state is achieved.

(Circuit Configuration and Layout)

Figure 4:
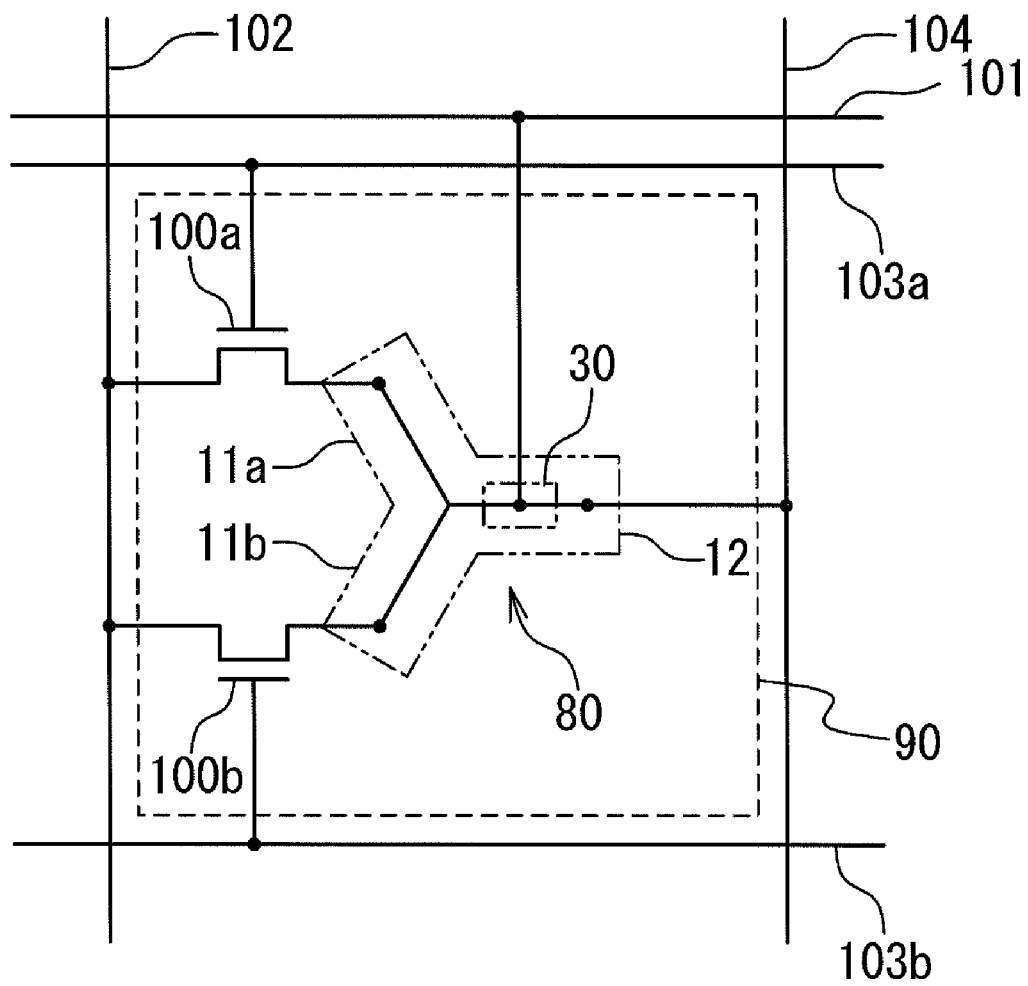
FIG. 4 is a circuit diagram illustrating an example of a configuration of an MRAM according to the exemplary embodiment of the present invention.

Next, a circuit configuration is described, which is for supplying a write current and a read current through the magnetoresistance effect element 80 according to the present exemplary embodiment. FIG. 4 is a circuit diagram illustrating an example of a configuration of the MRAM according to the exemplary embodiment of the present invention. The magnetic memory cell 90 included in the MRAM includes two MOS transistors 100a and 100b. One of a source/drain of the first MOS transistor 100a is connected to a ground line 102, and the other one is connected to one end (on a side opposite to the boundary with the magnetization free region 12) of the first magnetization pinned region 11a. A gate of the first MOS transistor 100a is connected to a first word line 103a. Also, one of a source/drain of the second MOS transistor 100b is connected to the ground line 102, and the other one is connected to one end (on a side opposite to the boundary with the magnetization free region 12) of the second magnetization pinned region 11b. A gate of the second MOS transistor 100b is connected to a second word line 103b.

Also, the end part of the magnetization free region 12 (on a side opposite to the boundaries with the first magnetization pinned region 11a and the second magnetization pinned region 11b) is connected with a first bit line 104. The first bit line 104 is a write wiring line for supplying the write current to the first ferromagnetic layer 10. Also, the second ferromagnetic layer 30, which is one end of the MTJ, is connected with a second bit line 101. The second bit line 101 is a read wiring line for supplying the read current to the MTJ.

In the circuit configuration as illustrated in FIG. 4, the information "1" is written in the following manner. To write the information "1", the current is supplied from the magnetization free region 12 to the second magnetization pinned region 11b. For this purpose, the first word line 103a, the second word line 103b, the first bit line 104, and the ground line 102 are respectively set to "Low", "High", "High", and "Ground". In this case, the first MOS transistor 100a is turned "OFF", and the second MOS transistor 100b is turned "ON". For this reason, the current flows from the first bit line 104 to the ground line 102 through the magnetization free region 12, the second magnetization pinned region 11b, and the second MOS transistor 100b. This corresponds to a current direction at the time of writing of data "1".

Also, the information "0" is written in the following manner. To write the information "0", the current is supplied from the magnetization free region 12 to the first magnetization pinned region 11a. For this purpose, the first word line 103a, the second word line 103b, the first bit line 104, and the ground line 102 are respectively set to "High", "Low", "High", and "Ground". In this case, the first MOS transistor 100a is turned "ON", and the second MOS transistor 100b is turned "OFF". For this reason, the current flows from the first bit line 104 to the ground line 102 through the magnetization free region 12, the first magnetization pinned region 11a, and the first MOS transistor 100a. This corresponds to a current direction at the time of writing of data "0".

Also, data can be read by, for example, a first method described below.

In the first method, the first and second word lines 103a and 103b are set to "Low", the second bit line 101 to "High", and the first bit line 104 to "Ground". In this case, the first and second MOS transistors 100a and 100b are turned "OFF", and therefore the current flows from the second bit line 101 to the first bit line 104 through the MTJ (the second ferromagnetic layer 30, the insulating layer 20, and the magnetization free region 12 of the first ferromagnetic layer 10). This enables a resistance of the MTJ to be read thereby enabling the data of the magnetoresistance effect element 80 to be read. In this case, information in the cell at a cross-point between the first bit line 104 and the second bit line 101 is read, i.e., cross-point reading is performed.

Also, data may be read by, for example, a second method as described below.

In the second method, first, the first and second word lines 103a and 103b are respectively set to "High" and "Low", and the first and second MOS transistors 100a and 100b are respectively turned "ON" and "OFF". Also, the ground line 102 is set to "Ground", and the second bit line 101 is set to "High". Further, the first bit line 104 is set to an appropriate potential. In this case, the read current flows from the second bit line 101 to the ground line 102 through the MTJ and the first MOS transistor 100a without flowing in the first bit line 104. This also enables the resistance value of the MTJ to be read. The second method enables high speed reading because one cell is selected by a transistor, differently from the cross-point reading used in the first method. Note that the transistor to be used may be the second MOS transistor 100b.

Figure 5:
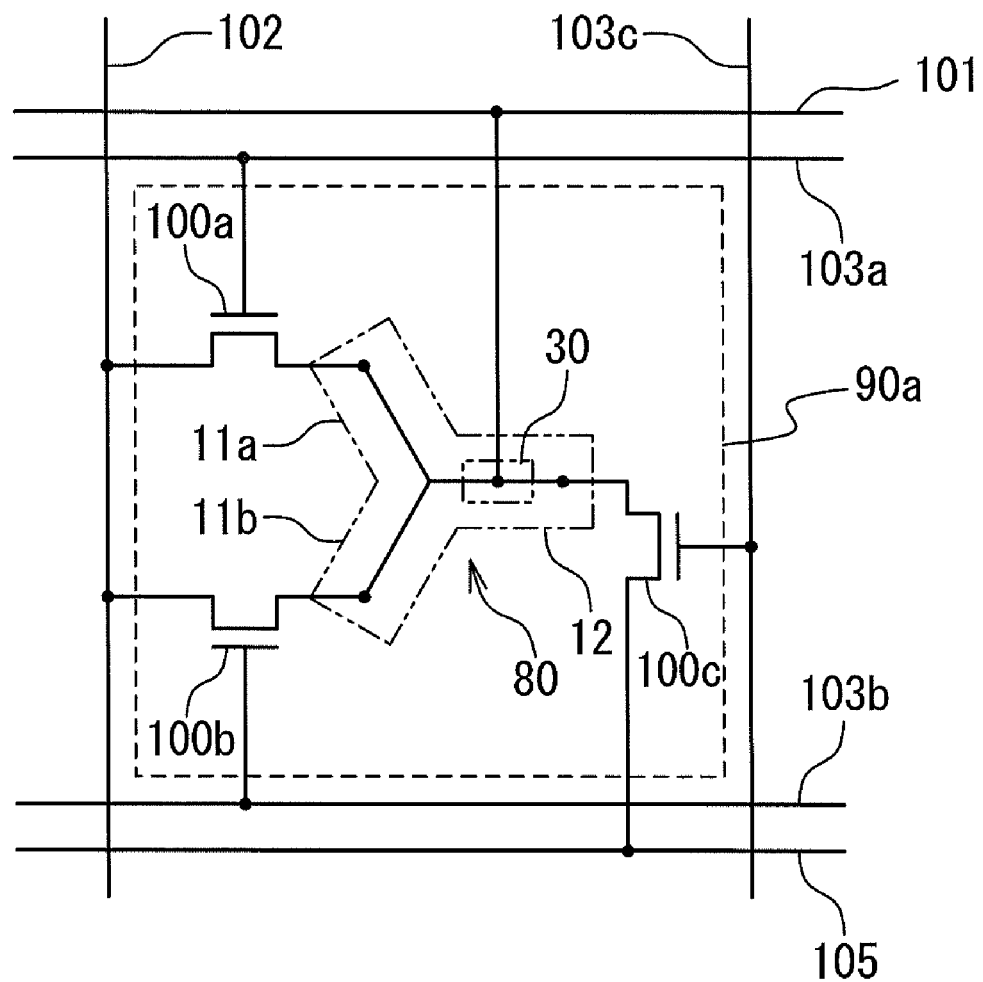
FIG. 5 is a circuit diagram illustrating another example of the configuration of the MRAM according to the exemplary embodiment of the present invention.

As the magnetic memory cell according to the present exemplary embodiment, another circuit configuration may be used. FIG. 5 is a circuit diagram illustrating another example of the configuration of the MRAM according to the exemplary embodiment of the present invention. A difference between a magnetic memory cell 90a included in the MRAM and the magnetic memory cell 90 of FIG. 4 is that three MOS transistors are provided within the magnetic memory cell 90a. Specifically, one of a source/drain of a third MOS transistor 100c is connected to the end part the magnetization free region 12 (on the side opposite to the first magnetization pinned region 11a and the second magnetization pinned region 11b), and the other one is connected to a third bit line 105. A gate of the third MOS transistor 100c is connected to a third word line 103c.

In the magnetic memory cell 90a, to write the information "1", the first, second, and third word lines 103a, 103b, and 103c are respectively set to "Low", "High", and "High". In this case, the first, second, and third MOS transistors 100a, 100b, and 100c are respectively turned "OFF", "ON", and "ON". If the third bit line 105 and ground line 102 are respectively set to "High" and "Ground" in this state, a current flows from the third bit line 105 to the ground line 102 through the third MOS transistor 100c, the magnetization free region 12, the second magnetization pinned region 11b, and the second MOS transistor 100b to perform the "1" writing.

On the other hand, to write the information "0", the first, second, and third word lines 103a, 103b, and 103c are respectively set to "High", "Low", and "High". In this case, the first, second, and third MOS transistors 100a, 100b, and 100c are respectively turned "ON", "OFF", and "ON". If the third bit line 105 and the ground line 102 are respectively set to "High" and "Ground" in this state, the current flows from the third bit line 105 to the ground line 102 through the third MOS transistor 100c, the magnetization free region 12, the first magnetization pinned region 11a, and the first MOS transistor 100a to perform the "0" writing.

Information can be read from the magnetic memory cell 90a, for example, in the following manner. First, the first, second, and third word lines 103a, 103b, and 103c are respectively set to "Low", "Low", and "High". In this case, the first, second, and third MOS transistors 100a, 100b, and 100c are respectively turned "OFF", "OFF", and "ON". By setting the second and third bit lines 101 and 105 to "High" and "Low" in this state, a current passes through the MTJ from the second bit line 101, and flows into the first bit line 105 through the third MOS transistor. This enables data to be read.

Note that the circuit configurations and circuit settings described here are only examples for information writing/reading in the magnetoresistance effect element 80 according to the present invention. That is, the present invention is not limited to any of the examples, but can be carried out even with use of another circuit configuration and circuit setting.
(Effects)

As a first effect of the present invention, a reduction in a write current is achieved. This results from the fact that the layer in which the domain wall motion occurs upon writing of information has the magnetic anisotropy in the perpendicular direction. From micromagnetics calculations using an LLG equation taking into account the spin transfer torque, it turns out that, in the case of a domain wall formed of a material having the perpendicular magnetic anisotropy, as compared with the case of a domain wall formed of a material having in-plane magnetic anisotropy, a current density necessary for current drive is sufficiently small, whereas a magnetic field necessary for magnetic field drive is sufficiently large.

According to A. Thiaville, et al., "Micromagnetic understanding of current-driven domain wall motion in patterned nanowires", Europhysics Letters, vol. 69, pp. 990-996 (2005), the LLG equation taking into account the spin transfer torque is as follows (see pp. 992, $$\frac{\partial \vec{m}}{\partial t} = \gamma_0 \vec{H} \times \vec{m} + \alpha \vec{m} \times \frac{\partial \vec{m}}{\partial t} - (\vec{u} \cdot \vec{\nabla})\vec{m} + \beta \vec{m} \times [(\vec{u} \cdot \vec{\nabla})\vec{m}]$$ Expression (3))

If the left-hand side is configured to represent a time variation in magnetization ($\partial m/\partial t$), the right-hand side includes [1] a term representing a torque by a magnetic field, [2] a damping term, [3] an adiabatic spin torque term, and [4] a nonadiabatic spin torque term. From the micromagnetics calculations, it turns out that the domain wall formed of a material having the perpendicular magnetic anisotropy is driven by [3] the adiabatic spin torque term even at a current density of approximately $1\times10^8$ [A/cm$^2$], whereas the domain wall formed of a material having the in-plane magnetic anisotropy is not driven at the current density of approximately $1\times10^8$ [A/cm$^2$] without [4] the nonadiabatic spin torque term. In the case of the domain wall drive by [3] the adiabatic spin torque term, it is known that, if pinning is not excessively large, the domain wall can be depinned from a pinning site independently of a pinning magnetic field. Accordingly, it turns out that, as compared with the material having the in-plane magnetic anisotropy in which the domain wall drive by [3] the adiabatic spin torque term is impossible, the material having the perpendicular magnetic anisotropy in which the domain wall drive by [3] the adiabatic spin torque term is possible easily achieves both strong domain wall pinning and the domain wall drive by a low current density. That is, it turns out that, by using the material having the perpendicular magnetic anisotropy, a current required for writing can be reduced with keeping a sufficient value as thermal stability.

As a configuration example of a simple element, we assume, for example, that an element width (w) is 100 nm, a film thickness (t) is 2 nm, half of a width of a pinning site for a domain wall (q0) is 15 nm, saturation magnetization (MS) is 500 [emu/cm$^3$], spin polarizability (P) is 0.5, and threshold magnetic field at the pinning site for the domain wall (HC) is 1000 [Oe]. In this case, $\Delta E/k_B T$ serving as a thermal stability index is 40. Here, $k_B$ is the Boltzmann constant, and T is an absolute temperature. It turns out from the micromagnetics calculations that, in the case of assuming such a system, a current density necessary to depin the domain wall from the pinning site is approximately $2\times10^7$ [A/cm$^2$]. In this case, a write current of the element is 0.04 [mA].

On the other hand, as an example of the case where the material having the in-plane magnetic anisotropy is used to achieve the same thermal stability index ($\Delta E/k_B T=40$), we assume that an element width (w) is 100 nm, a film thickness (t) is 10 nm, half of a width of a pinning site for a domain wall (q0) is 40 nm, saturation magnetization (MS) is 800 [emu/cm$^3$], spin polarizability (P) is 0.7, and threshold magnetic field at the pinning site for the domain wall (HC) is 50 [Oe]. It turns out from the micromagnetics calculations that a current density necessary to depin the domain wall from the pinning site in such a system is approximately $6\times10^8$ [A/cm$^2$]. From the perspectives of heat generation and electron migration, it is essentially impractical to flow such current density to the element; however, we here use the value for comparison. In this case, a write current to the element having the in-plane magnetization film is 6 [mA].

As described, it turns out that, by using the material having the perpendicular magnetic anisotropy for the layer in which the domain wall motion occurs, a significant reduction in a write current is achieved as compared with the case of using the material having the in-plane magnetic anisotropy for the layer in which the domain wall motion occurs.

Note that the parameters used here are only rough measures, and therefore other values can also be used. Accordingly, a current value necessary for writing and thermal stability $\Delta E/k_B T$ vary corresponding to the varied parameters; however, the current value and the thermal stability vary basically in conjunction with each other, and therefore the magnitude relationship in the write current between the in-plane magnetization film and the perpendicular magnetization film as described above is not considerably reversed.

In addition, it turns out from the micromagnetics calculations that, in the material having the perpendicular magnetic anisotropy, the current density necessary for the case of driving the domain wall with current reduces as the film thickness is decreased, differently from the material having the in-plane magnetic anisotropy. As the film thickness is decreased, a total current amount obviously reduces; however, in the perpendicular magnetic anisotropy material, the current density reduces in addition to this, and therefore by using the perpendicular magnetic anisotropy material, the write current can be effectively reduced.

Also, as a second effect of the present invention, we point out the achievement of a wide write margin and a stable write operation. This results from the fact that the first ferromagnetic layer 10 typically has the "junction of three roads" shape and the domain wall completely passes through the first ferromagnetic layer 10 thereby performing writing. In the MRAM using the domain wall motion disclosed in JP 2005-191032 A, the domain wall is moved from a pinning site serving as the starting point to a pinning site serving as the reaching point thereby performing writing. In this case, it is concerned that the domain wall moves beyond the pinning site serving as the reaching point, or the domain wall does not reach the pinning site but stops on the way, and consequently a magnitude or a pulse length of a write current is limited within a finite margin. In addition, it is also concerned that even if the domain wall reaches the pinning site serving as the reaching point and stops at the site when the write current flows, if energy arising from a magnetization direction in the domain wall is stored, the domain wall escapes from the pinning site serving as the reaching point when the current is switched off, and moves to the other stable point. Such concerned points are solved by the write method of the present invention in which a domain wall is completely passed through.

Further, as a third effect of the present invention, the facilitation of write current control and the simplification of a peripheral circuit are achieved. This also results from the fact that the first ferromagnetic layer 10 typically has the "junction of three roads" shape. It can be said that, in the magnetoresistance effect element 80 according to the present invention, the first magnetization pinned region 11a and the second magnetization pinned region 11b play roles as supply sources of electrons having different spin magnetic moments, respectively. According to the present exemplary embodiment, electrons having different spins are injected to the magnetization free region 12 through the same boundary. In other words, in either case of the "0" writing or "1" writing, the write current flows in the magnetization free region 12 in the same direction. In such a case, different write current is also only required to be supplied to the magnetization free region 12 of the first ferromagnetic layer 10 from one direction. Accordingly, the write current control and a configuration of the peripheral circuit can be simplified.

As a fourth effect of the present invention, cost reduction associated with the omission of a magnetic shield is achieved. This is because the perpendicular magnetic anisotropy material has sufficiently large crystal magnetic anisotropy, and therefore extremely large resistance to a disturbance magnetic field as compared with the in-plane magnetic film. In the material having the magnetic anisotropy in the in-plane direction, the magnetic shield is practically required; however, according to the present invention, to ensure the disturbance magnetic field resistance, the magnetic shield is not required, and therefore low cost manufacturing becomes possible.

(Materials)

We here exemplify materials for the respective layers. Note that the materials described here are all examples, and in practice, any material may be used as far as the magnetization states as described above can be achieved.

First, materials for the first, second, and third ferromagnetic layers 10, 30, and 15 desirably include at least one material selected from Fe, Co, and Ni. Further, by incorporating Pt or Pd, the perpendicular magnetic anisotropy can be stabilized. In addition to this, by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm, or the like, an adjustment can be made so as to exhibit desired magnetic properties. Specifically, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd–Fe—Co, Tb—Fe—Co, Gd—Tb—Fe—Co, or the like is exemplified. Besides, by stacking a layer including any one material selected from Fe, Co, and Ni on a different layer, the perpendicular magnetic anisotropy can also be exhibited. Specifically, a stacked layer of Co/Pd, Co/Pt, Co/Ni, Fe/Au, or the like is exemplified. Note that the third ferromagnetic layer 15 may be a material having the perpendicular magnetic anisotropy or in-plane magnetic anisotropy. In the case of using the material having the in-plane magnetic anisotropy, Co—Fe, Ni—Fe, or the like is exemplified.

The insulating layer 20 is desirably formed of an insulating material. Specifically, Mg—O, Al—O, Al—N, Ni—O, Hf—O, or the like is exemplified. However, besides, even with use of a semiconductor or metal material, the present invention can be carried out. Specifically, Cr, Al, Cu, Zn, or the like is exemplified. The electrode layer 115 is desirably formed of an electrically conductive material having low electrical resistance. Specifically, Cu, Al, or the like is exemplified.

(Initialization Method for Magnetization Pinned Regions)

Next, an initialization methods for the magnetizations of the first magnetization pinned region 11a and the second magnetization pinned region 11b is described. Regarding the initialization method for the magnetizations of the first magnetization pinned region 11a and the second magnetization pinned region 11b, various methods can be used. FIGS. 6 to 13 illustrate configuration examples of the magnetoresistance effect element 80, and corresponding initialization methods. Note that the present invention is not limited to any of them, but any configuration and initialization method other than those described here may be used to initialize the magnetizations of the first magnetization pinned region 11a and the second magnetization pinned region 11b so as to be antiparallel to each other.

1. First Configuration Example

Figure 6:
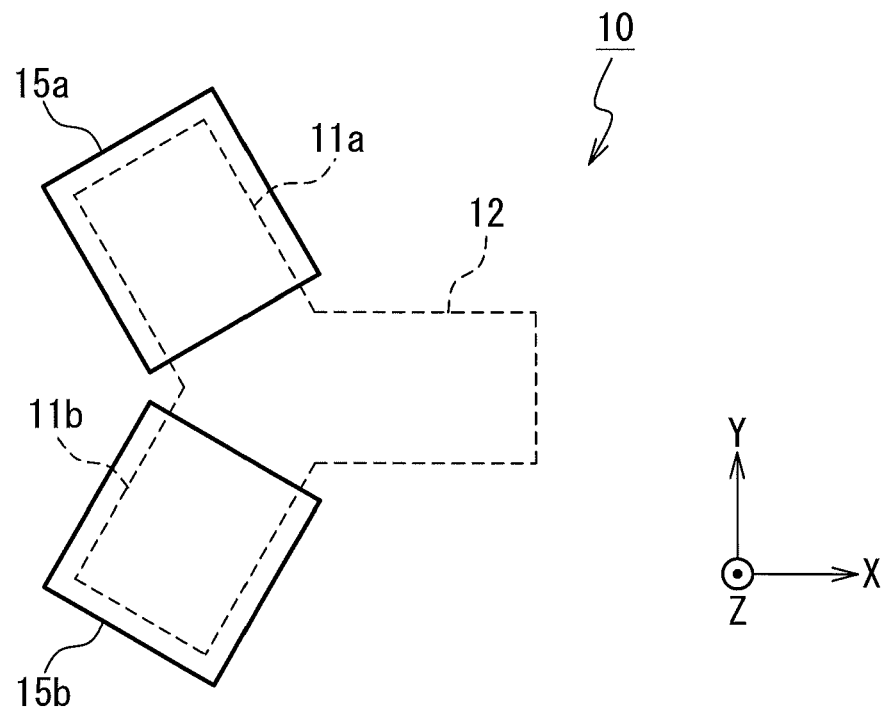
FIG. 6 is a diagram illustrating a first configuration example of the magnetoresistance effect element according to the exemplary embodiment of the present invention.

FIG. 6 is a diagram illustrating a first configuration example of the magnetoresistance effect element according to the exemplary embodiment of the present invention. In the first configuration example, a first third ferromagnetic layer 15a is provided adjacent to the first magnetization pinned region 11a of the first ferromagnetic layer 10, and a second third ferromagnetic layer 15b is provided adjacent to the second magnetization pinned region 11b. The first third ferromagnetic layer 15a and the second third ferromagnetic layer 15b are both formed of a material having a magnetic anisotropy component in a direction perpendicular to a film surface. Also, between the first third ferromagnetic layer 15a and the second third ferromagnetic layer 15b, a difference in coercive force in the direction perpendicular to the film surface is provided. By providing the difference in coercive force between the first third ferromagnetic layer 15a and the second third ferromagnetic layer 15b, the initialization becomes possible by applying a two-step magnetic field in the direction perpendicular to the film surface.

For example, given that the coercive force of the first third ferromagnetic layer 15a is denoted by Hca, and that of the second third ferromagnetic layer 15b by Hcb, Hca>Hcb is assumed to hold. Also, a coercive force Hc0 of the first ferromagnetic layer 10 is assumed to meet Hcb>Hc0. Under such conditions, an external magnetic field Hext1 meeting Hext1>Hca is first applied in the film surface perpendicular direction (+z direction in the diagram). As a result, the magnetizations of the first ferromagnetic layer 10, and the first third ferromagnetic layer 15a and the second third ferromagnetic layer 15b are all saturated in the +z direction. Then, an external magnetic field Hext2 meeting Hca>Hext2>Hcb is applied in a −z direction. At this time, magnetization switching does not occur in the first third ferromagnetic layer 15a, and therefore magnetization switching of the first magnetization pinned region 11a magnetically coupled to the first third ferromagnetic layer 15a also does not occur. However, in the other parts, magnetization switching due to Hext 2 occurs, and therefore initialization to the "1" state illustrated in the right-hand side diagrams of FIGS. 2 and 3 becomes possible.

The difference in coercive force in the film surface perpendicular direction can be provided by several methods described below.

In a first one of the methods, the first third ferromagnetic layer 15a and the second third ferromagnetic layer 15b are formed of different materials. By using materials respectively having different coercive forces in the direction perpendicular to the film surface, the difference in coercive force can be provided between the first third ferromagnetic layer 15a and the second third ferromagnetic layer 15b. Note that the materials having different coercive forces can be provided by a difference in constituent element or composition, or by a difference in structure such as a crystal structure or defect, or textural factor.

Also, in a second method, the first third ferromagnetic layer 15a and the second third ferromagnetic layer 15b are configured to respectively have different easy magnetization axis directions. In this case, by aligning the magnetizations of the both third ferromagnetic layers 15 in substantially the same direction, and then applying a magnetic field in a direction so that magnetization switching occurs in only one of the third ferromagnetic layers 15, the initialization becomes possible. The difference in easy magnetization axis can be achieved on the basis of crystal magnetic anisotropy, or shape magnetic anisotropy.

Further, in a third method, the first third ferromagnetic layer 15a and the second third ferromagnetic layer 15b are provided so as to respectively have different film thicknesses. In this case, in general, as a film thickness is increased, a coercive force in the perpendicular direction increases, and therefore this can provide the difference in coercive force.

Still further, in a fourth method, an auxiliary layer is provided adjacent to one of the third ferromagnetic layers 15. As a material for the auxiliary layer, a ferromagnetic material having large or small magnetic anisotropy may be used, or alternatively an antiferromagnetic material may be used. In the third ferromagnetic layer 15 provided with the auxiliary layer, the coercive force is varied, and therefore this can provide the difference in coercive force between the third ferromagnetic layers 15. Note that, in the case of using the ferromagnetic material having large magnetic anisotropy as the auxiliary layer, an apparent coercive force of the third ferromagnetic layer 15 adjacently provided with the auxiliary layer increases. Also, in the case of using the ferromagnetic material having small magnetic anisotropy as the auxiliary layer, an apparent coercive force of the third ferromagnetic layer 15 adjacently provided with the auxiliary layer decreases. Further, in the case of using the antiferromagnetic material as the auxiliary layer, an apparent coercive force of the third ferromagnetic layer 15 adjacently provided with the auxiliary layer increases. Note that a position of the auxiliary layer relative to the third ferromagnetic layer 15 is arbitrary, and they are only required to be magnetically coupled to each other, and may be electrically isolated from each other.

Yet further, in a fifth method, the first third ferromagnetic layer 15a and the second third ferromagnetic layer 15b are patterned to respectively have different sizes. In this case, a larger sized one of the third ferromagnetic layers 15 have a smaller coercive force. This can provide the difference in coercive force between the third ferromagnetic layers 15.

Yet still further, in a sixth method, at least one of the first third ferromagnetic layer 15a and the second third ferromagnetic layer 15b is patterned in an anisotropic shape, which is different from a shape of the other one, in the xy-plane. Also, as the magnetic field used for the initialization, a magnetic field including x component and y component in addition to the z component that is in the direction perpendicular to the film surface is applied. In this case, between the first third ferromagnetic layer 15a and the second third ferromagnetic layer 15b, the difference in coercive force is produced in an applied magnetic field direction, and therefore this enables the initialization.

Also, the difference in coercive force can also be provided between the first third ferromagnetic layer 15a and the second third ferromagnetic layer 15b by a method other than those described above. Further, the methods described above can also be used in combination.

2. Second Configuration Example

Figure 7A:
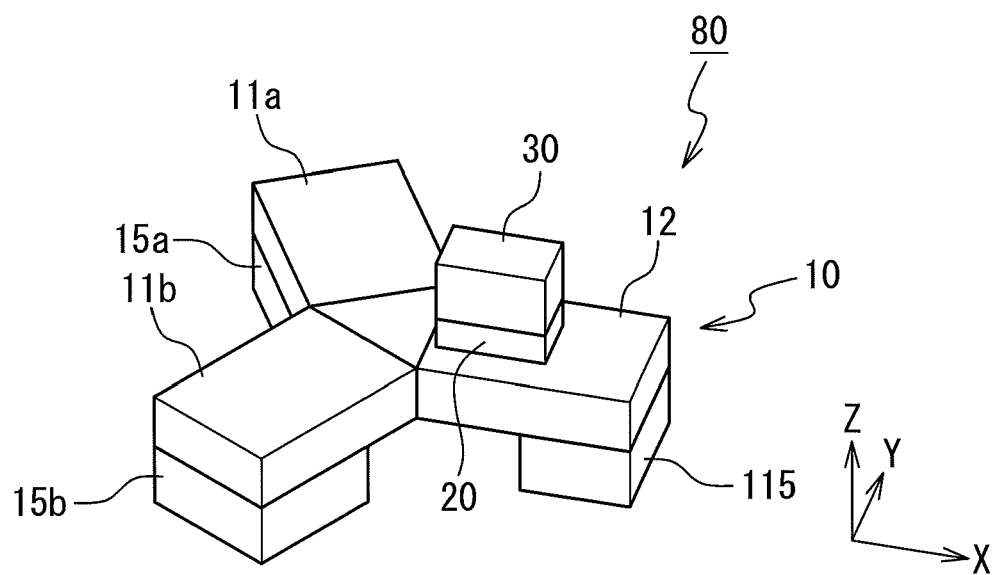
FIG. 7A is a perspective view illustrating a second configuration example of the magnetoresistance effect element according to the exemplary embodiment of the present invention.
Figure 7B:
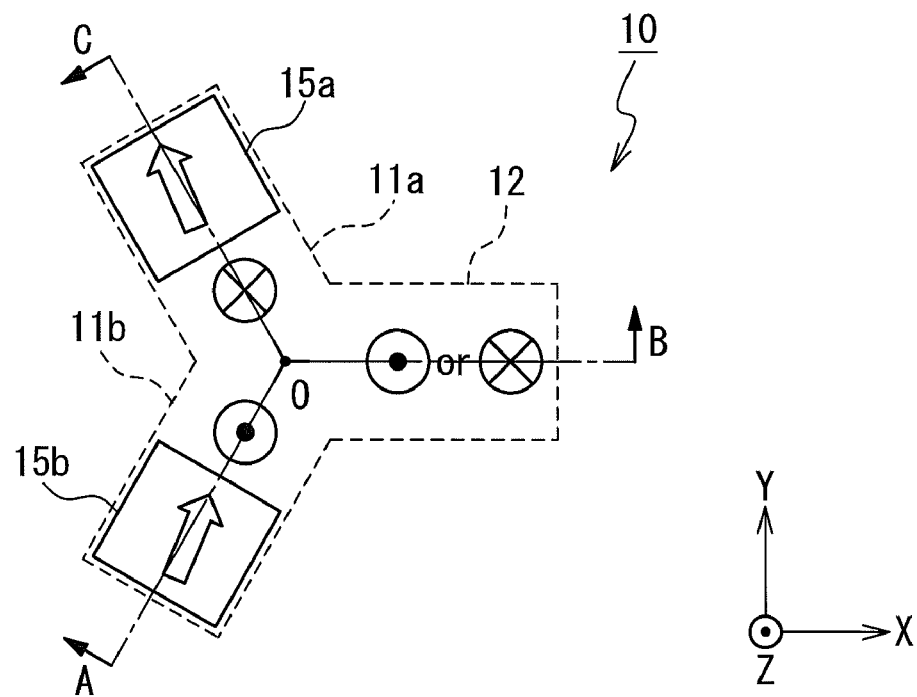
FIG. 7B is a plan view illustrating the second configuration example of the magnetoresistance effect element according to the exemplary embodiment of the present invention.
Figure 7C:
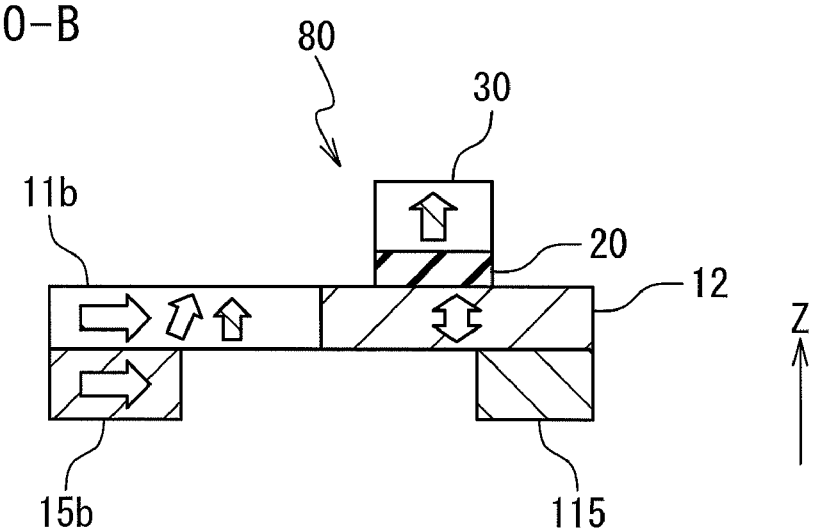
FIG. 7C is a cross-sectional view illustrating the second configuration example of the magnetoresistance effect element according to the exemplary embodiment of the present invention.

FIGS. 7A, 7B, and 7C are a perspective view, a plan view, and a cross-sectional view illustrating a second configuration example of the magnetoresistance effect element according to the exemplary embodiment of the present invention. Note that FIG. 7B is an xy-plan view, and FIG. 7C is an A-O-B cross-sectional view in FIG. 7B. In the second configuration example, the first third ferromagnetic layer 15a is provided adjacent to the first magnetization pinned region 11a of the first ferromagnetic layer 10, and the second third ferromagnetic layer 15b is provided adjacent to the second magnetization pinned region 11b. The first third ferromagnetic layer 15a and the second third ferromagnetic layer 15b are both formed of a material having a magnetic anisotropy component in a film surface longer side direction. Also, the first ferromagnetic layer 10, the insulating layer 20, and the second ferromagnetic layer 30 form the magnetic tunnel junction (MTJ).

In FIGS. 7B and 7C, an example of possible states as magnetization directions of respective parts in the second configuration example is indicated by white arrows. That is, the magnetization free region 12, the first magnetization pinned region 11a, and the second magnetization pinned region 11b are respectively magnetized in any of the ±z-directions corresponding to the direction perpendicular to the film surface, in the −z direction corresponding to the direction perpendicular to the film surface, and in the +z direction corresponding to the direction perpendicular to the film surface. However, a part of the first magnetization pinned region 11a, which is in contact with the first third ferromagnetic layer 15a, and a part of the second magnetization pinned region 11b, which is in contact with the second third ferromagnetic layer 15b, respectively have magnetizations in their film surface longer side directions similarly to the third ferromagnetic layers 15. Note that the second ferromagnetic layer 30 is magnetized in the +z direction corresponding to the direction perpendicular to the film surface.

Figure 8:
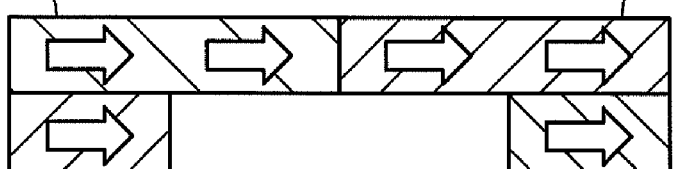
FIG. 8 is a conceptual diagram illustrating an initialization method for the second configuration example of the magnetoresistance effect element according to the exemplary embodiment of the present invention.
Figure 8:
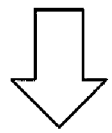
Figure 8:
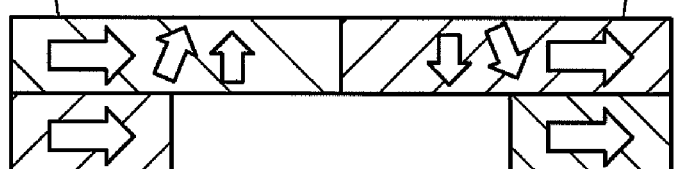

The magnetization states as illustrated in FIGS. 7B and 7C can be achieved by an initialization process as illustrated in FIG. 8. FIG. 8 is a conceptual diagram illustrating the initialization method for the second configuration example of the magnetoresistance effect element according to the exemplary embodiment of the present invention. FIG. 8 illustrates an A-O-C cross-section in FIG. 7B. In the second configuration example, for example, a uniform and sufficiently large external magnetic field is first applied in the +y direction. The magnetization states of the first ferromagnetic layer 10 and the third ferromagnetic layers 15 at this time are indicated by arrows in an upper diagram of FIG. 8. As illustrated in the upper diagram of FIG. 8, the magnetizations of the first ferromagnetic layer 10 and the third ferromagnetic layers 15 are saturated in their film surface longer side directions by the external magnetic field. Then, the magnetic field is gradually decreased to zero. At this time, the magnetizations are relaxed as illustrated in a lower diagram of FIG. 8. That is, the first ferromagnetic layer 10 has the magnetic anisotropy in the direction perpendicular to the film surface, and therefore the magnetization starts to rotate in the direction perpendicular to the film surface. On the other hand, around contact points of the first ferromagnetic layer 10 with the third ferromagnetic layers 15, the magnetization rotates so as to be gradually continuing. Accordingly, as illustrated in a lower diagram of FIG. 8, the magnetization around the contact point with the first third ferromagnetic layer 15a rotates downward, whereas the magnetization around the contact point with the second third ferromagnetic layer 15b rotates upward. Based on this, in the first magnetization pinned region 11a and the second magnetization pinned region 11b, domains with magnetizations antiparallel to each other grow, and finally, the magnetization states as illustrated in FIGS. 7B and 7C are achieved.

A positional relationship between the first ferromagnetic layer 10 and the third ferromagnetic layers 15 is arbitrary as far as the initialization based on the above-described principle can be performed. Accordingly, for example, the third ferromagnetic layers 15 may be provided in the +z direction from the first ferromagnetic layer 10. Also, the third ferromagnetic layers 15 and the first ferromagnetic layer 10 may be magnetically coupled to each other, but electrically isolated from each other. Further, the first third ferromagnetic layer 15a and the second third ferromagnetic layer 15b may have the same or different magnetic properties.

The third ferromagnetic layers 15 can be given a function of, upon initialization, rotating the magnetizations of the first magnetization pinned region 11a and the second magnetization pinned region 11b in directions antiparallel to each other, and also a function of pinning the domain wall formed at any one of the boundaries between the first magnetization pinned region 11a and the magnetization free region 12 and between the second magnetization pinned region 11b and the magnetization free region 12.

In addition, in the case of the second configuration example, the magnetizations of the parts of the first magnetization pinned region 11a and the second magnetization pinned region 11b, which are coupled to the third ferromagnetic layers 15, are oriented in their film surface longer side directions. Even in the case where the magnetizations of the parts of the first magnetization pinned region 11a and the second magnetization pinned region 11b are oriented in their film surface longer side directions as described, the present invention can be carried out. Note that, near the boundaries with the magnetization free region 12, the magnetizations of the first magnetization pinned region 11a and the second magnetization pinned region 11b are preferably oriented in the direction perpendicular to the film surface, and substantially antiparallel to each other.

3. Third Configuration Example

Figure 9A:
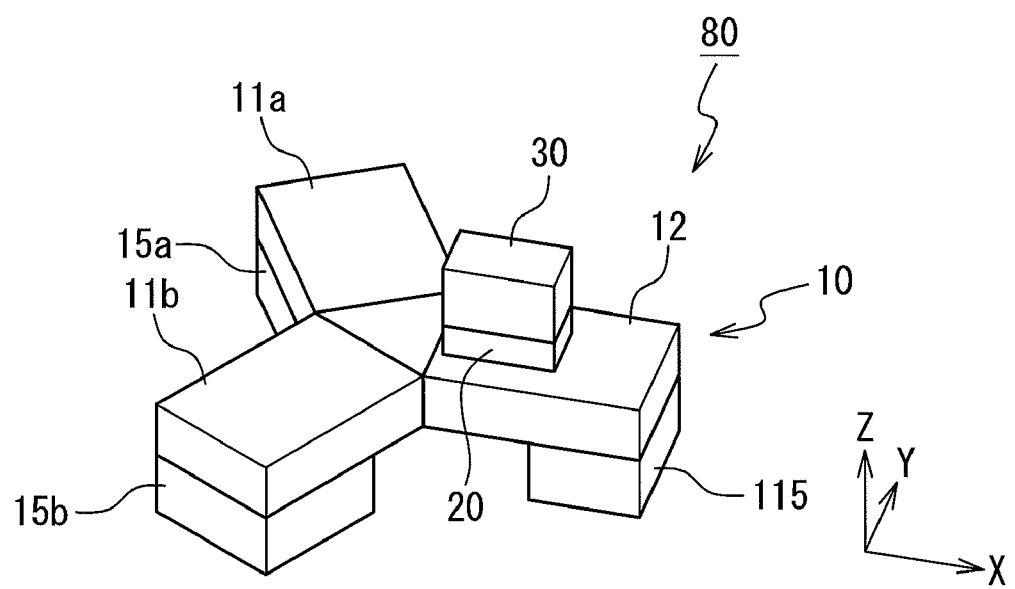
FIG. 9A is a perspective view illustrating a third configuration example of the magnetoresistance effect element according to the exemplary embodiment of the present invention.
Figure 9B:
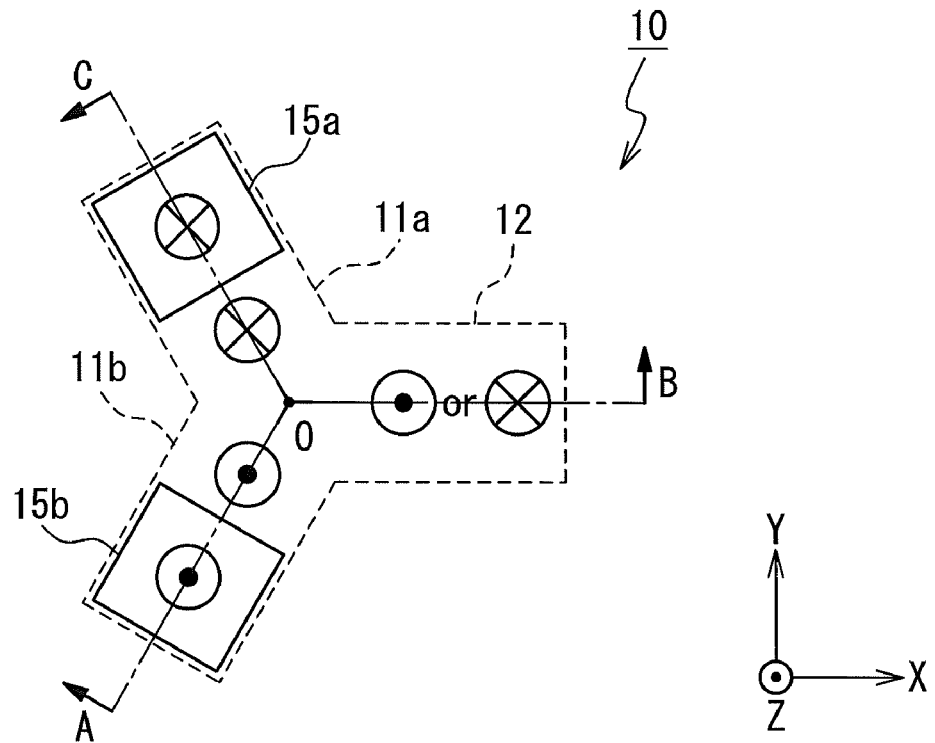
FIG. 9B is a plan view illustrating the third configuration example of the magnetoresistance effect element according to the exemplary embodiment of the present invention.
Figure 9C:
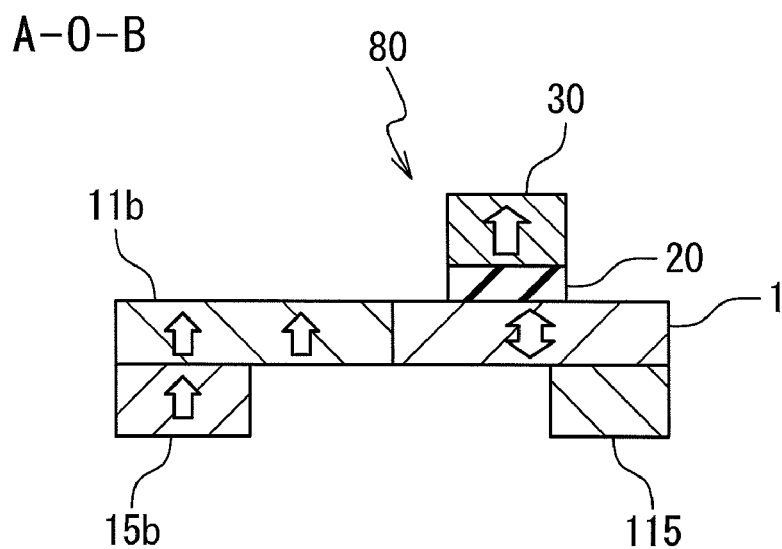
FIG. 9C is a cross-sectional view illustrating the third configuration example of the magnetoresistance effect element according to the exemplary embodiment of the present invention.

FIGS. 9A, 9B, and 9C are a perspective view, a plan view, and a cross-sectional view illustrating a third configuration example of the magnetoresistance effect element according to the exemplary embodiment of the present invention. Note that FIG. 9B is an xy-plan view, and FIG. 9C is an A-O-B cross-sectional view in FIG. 9B. In the third configuration example, the first third ferromagnetic layer 15a is provided adjacent to the first magnetization pinned region 11a of the first ferromagnetic layer 10, and the second third ferromagnetic layer 15b is provided adjacent to the second magnetization pinned region 11b. The first third ferromagnetic layer 15a and the second third ferromagnetic layer 15b are both formed of a material having the magnetic anisotropy component in the direction perpendicular to the film surface. Also, the first ferromagnetic layer 10, the insulating layer 20, and the second ferromagnetic layer 30 form the magnetic tunnel junction (MTJ).

In FIGS. 9B and 9C, an example of possible states as magnetization directions of respective parts in the third configuration example is indicated by arrows. That is, the magnetization free region 12, the first magnetization pinned region 11a, and the second magnetization pinned region 11b are respectively magnetized in any of the ±z directions corresponding to the film surface perpendicular direction, in the −z direction corresponding to the direction perpendicular to the film surface, and in the +z direction corresponding to the direction perpendicular to the film surface. Similarly, the first third ferromagnetic layer 15a and the second third ferromagnetic layer 15b respectively have the magnetizations in their film surface longer side directions. Note that the second ferromagnetic layer 30 is magnetized in the +z direction corresponding to the direction perpendicular to the film surface.

Figure 10:
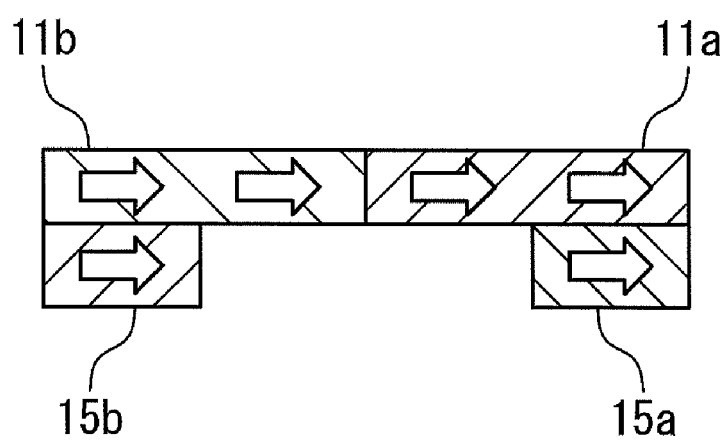
FIG. 10 is a conceptual diagram illustrating an initialization method for the third configuration example of the magnetoresistance effect element according to the exemplary embodiment of the present invention.
Figure 10:
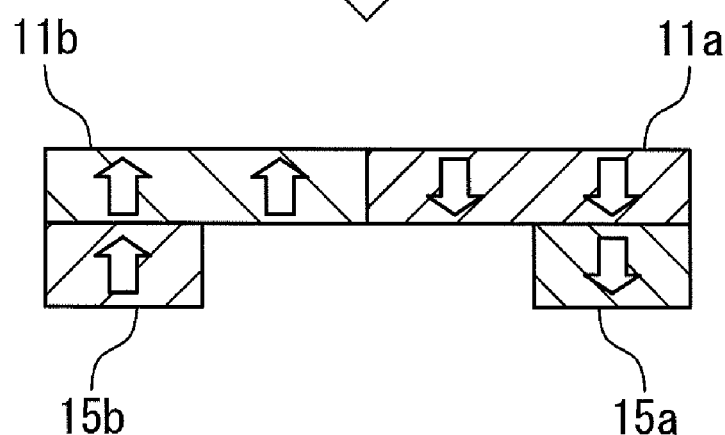

The magnetization states as illustrated in FIGS. 9B and 9C can be achieved by an initialization process as illustrated in FIG. 10. FIG. 10 is a conceptual diagram illustrating the initialization method for the third configuration example of the magnetoresistance effect element according to the exemplary embodiment of the present invention. FIG. 10 illustrates an A-O-C cross-section in FIG. 9B. In the third configuration example, for example, a uniform and sufficiently large external magnetic field is first applied in the +y direction. The magnetization states of the first ferromagnetic layer 10 and the third ferromagnetic layers 15 at this time are indicated by arrows in an upper diagram of FIG. 10. As illustrated in the upper diagram of FIG. 10, the magnetizations of the first ferromagnetic layer 10 and the third ferromagnetic layers 15 are saturated in their film surface longer side directions by the external magnetic field. Then, the magnetic field is gradually decreased to zero. At this time, the magnetizations are relaxed as illustrated in a lower diagram of FIG. 10. That is, all of the first ferromagnetic layer 10 and the third ferromagnetic layers 15 have the magnetic anisotropy in the direction perpendicular to the film surface, and therefore the magnetizations start to rotate in the direction perpendicular to the film surface. At this time, around contact points between the third ferromagnetic layers 15 and the first ferromagnetic layer 10, the magnetizations rotate so as to be gradually continuing. Accordingly, as illustrated in the lower diagram of FIG. 10, the magnetization on the first third ferromagnetic layer 15a side rotates downward, whereas the magnetization on the second third ferromagnetic layer 15b side rotates upward. Based on this, in the first magnetization pinned region 11a and the second magnetization pinned region 11b, domains with magnetizations antiparallel to each other grow, and finally, the magnetization states as illustrated in FIGS. 9B and 9C are achieved.

A positional relationship between the first ferromagnetic layer 10 and the third ferromagnetic layers 15 is arbitrary as far as the initialization based on the above-described principle can be performed. Accordingly, for example, the third ferromagnetic layers 15 may be provided in the +z direction from the first ferromagnetic layer 10. Also, the third ferromagnetic layers 15 and the first ferromagnetic layer 10 may be magnetically coupled to each other, but electrically isolated from each other. Further, the first third ferromagnetic layer 15a and the second third ferromagnetic layer 15b may have the same or different magnetic properties.

The third ferromagnetic layers 15 can be given a function of, upon initialization, rotating the magnetizations of the first magnetization pinned region 11a and the second magnetization pinned region 11b in directions antiparallel to each other, and also a function of pinning the domain wall formed at any one of the boundaries between the first magnetization pinned region 11a and the magnetization free region 12 and between the second magnetization pinned region 11b and the magnetization free region 12.

4. Fourth Configuration Example

Figure 11A:
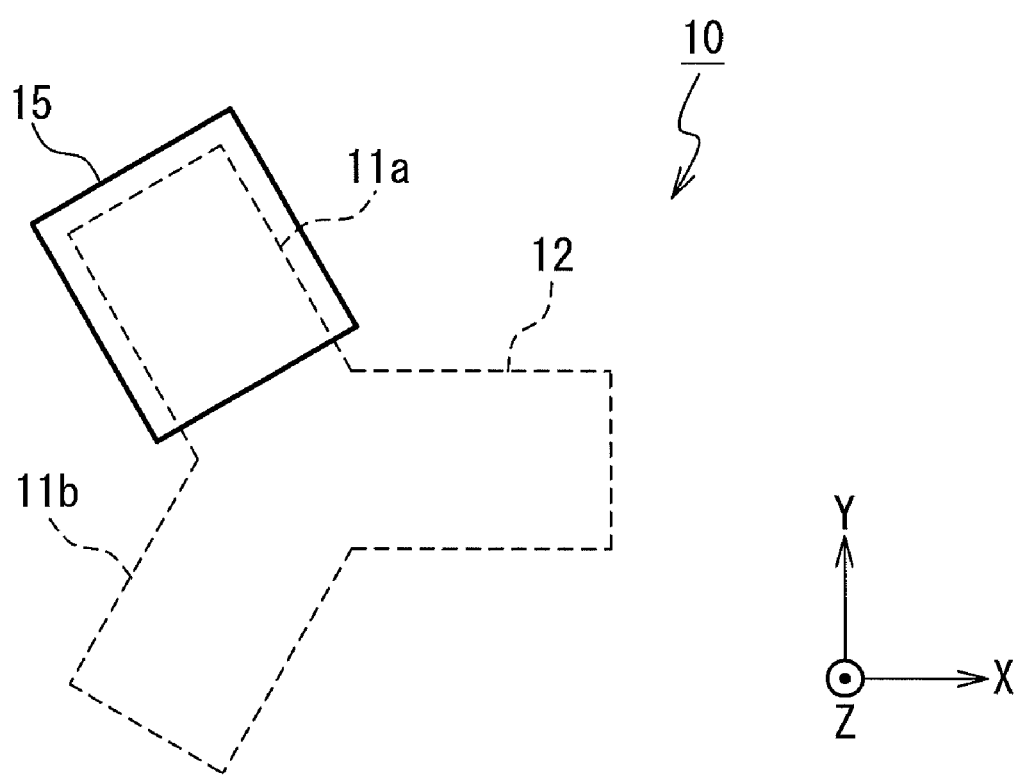
FIG. 11A is a plan view illustrating a fourth configuration example of the magnetoresistance effect element according to the exemplary embodiment of the present invention.
Figure 11B:
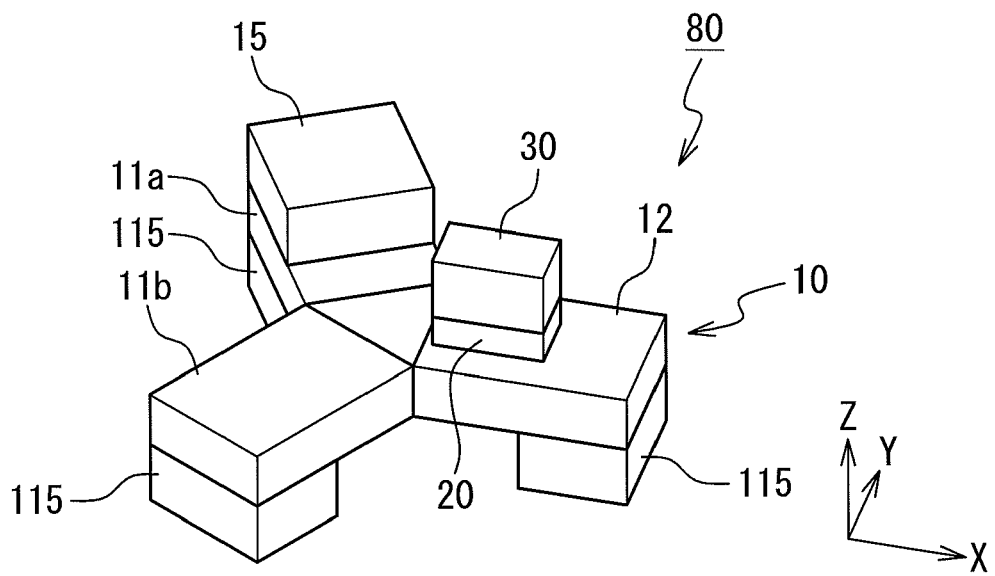
FIG. 11B is a perspective view illustrating the fourth configuration example of the magnetoresistance effect element according to the exemplary embodiment of the present invention.
Figure 11C:
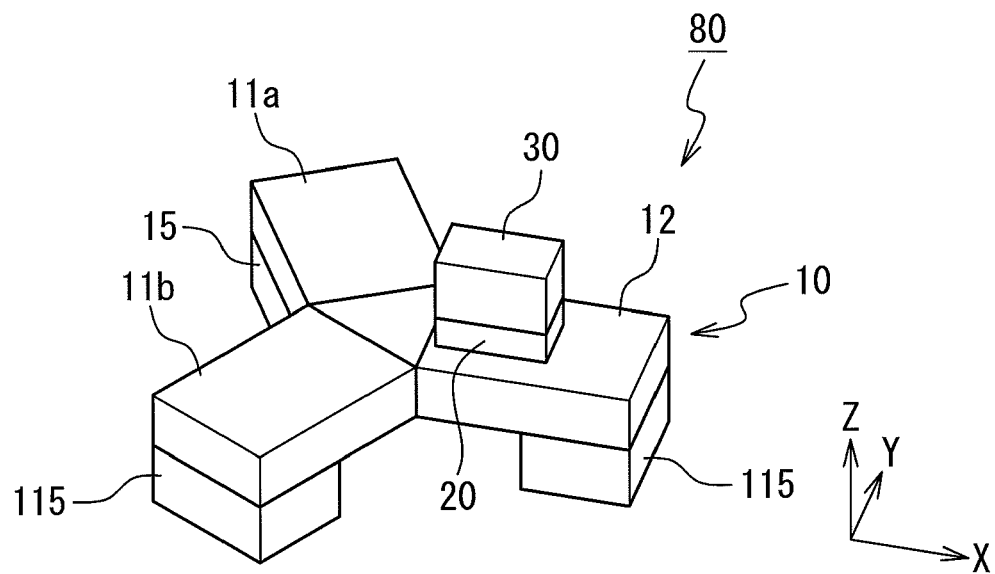
FIG. 11C is a perspective view illustrating another example of the fourth configuration example of the magnetoresistance effect element according to the exemplary embodiment of the present invention.

FIGS. 11A and 11B are a plan view and a perspective view illustrating a fourth configuration example of the magnetoresistance effect element according to the exemplary embodiment of the present invention. FIG. 11C is a perspective view illustrating another example of the fourth configuration example of the magnetoresistance effect element according to the exemplary embodiment of the present invention. Note that FIG. 11A is an xy-plan view. In the fourth configuration example, the third ferromagnetic layer 15 is provided adjacent to any one of the first magnetization pinned region 11a and the second magnetization pinned region 11b of the first ferromagnetic layer 10. In FIG. 11A, as an example, the third ferromagnetic layer 15 is provided adjacent to the first magnetization pinned region 11a. The third ferromagnetic layer 15 may be formed of a material having the magnetic anisotropy in the direction perpendicular to the film surface or the film surface longer side direction.

The fourth configuration example is essentially the same as the first configuration example. That is, between the first magnetization pinned region 11a and the second magnetization pinned region 11b, a difference in coercive force is provided, and the difference in coercive force can be used to perform the initialization. For example, the third ferromagnetic layer 15 is assumed to be adjacent to the first magnetization pinned region 11a, and if a coercive force of the third ferromagnetic layer 15 is large as compared with that of the first ferromagnetic layer 10, a coercive force of the first magnetization pinned region 11a is apparently large as compared with that of the second magnetization pinned region 11b. Accordingly, by applying a magnetic field in two steps, the initialization can be performed as described in the first configuration example.

In addition, the initialization can also be performed by using, as the third ferromagnetic layer 15, a material having the magnetic anisotropy in the film surface longer side direction, and applying a magnetic field in the film surface direction. Also, regarding a position of the third ferromagnetic layer 15, the third ferromagnetic layer 15 may be provided on the +z side of the first ferromagnetic layer 10 as illustrated in FIG. 11B, or on the −z side of the first ferromagnetic layer 10 as illustrated in FIG. 11C.

5. Fifth Configuration Example

Figure 12A:
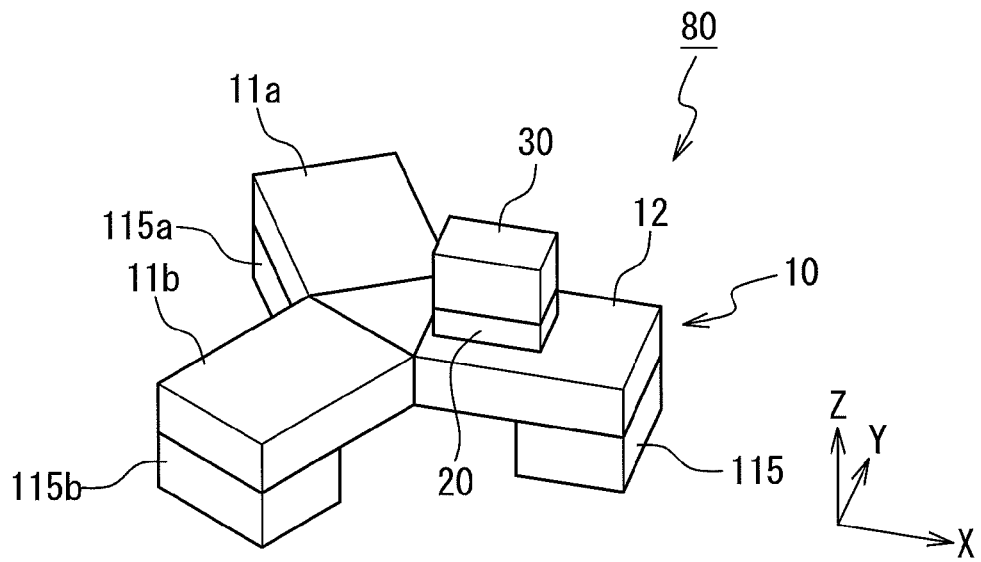
FIG. 12A is a perspective view illustrating a fifth configuration example of the magnetoresistance effect element according to the exemplary embodiment of the present invention.
Figure 12B:
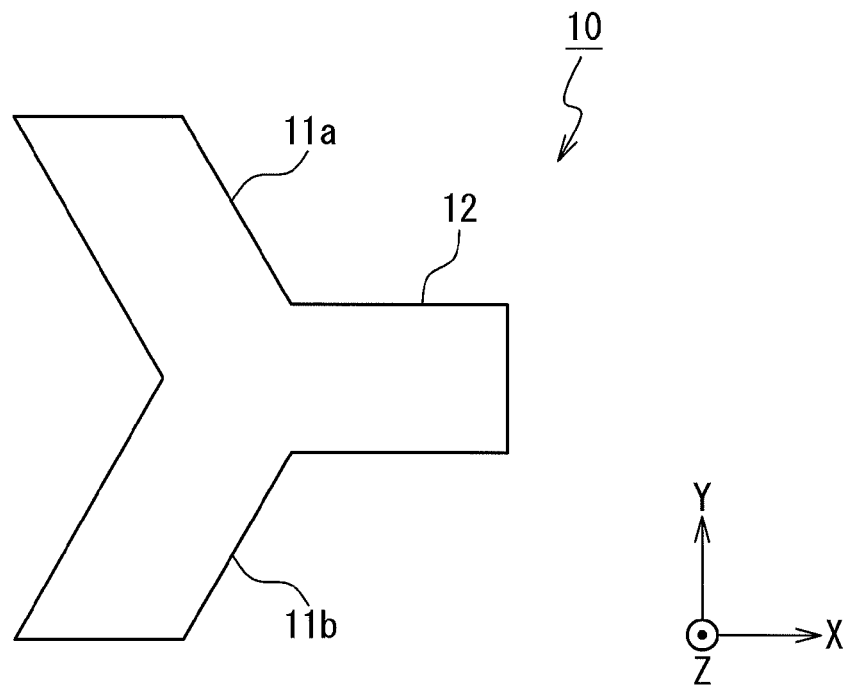
FIG. 12B is a plan view illustrating the fifth configuration example of the magnetoresistance effect element according to the exemplary embodiment of the present invention.

FIGS. 12A and 12B are a perspective view and a plan view illustrating a fifth configuration example of the magnetoresistance effect element according to the exemplary embodiment of the present invention. FIG. 12B illustrates an xy-plan view. In the fifth configuration example, the third ferromagnetic layer 15 is omitted. Even in this case, by applying an appropriate magnetic field in the xy plane in the following manner, the initialization of the first ferromagnetic layer 10 can be performed.

Figure 13:
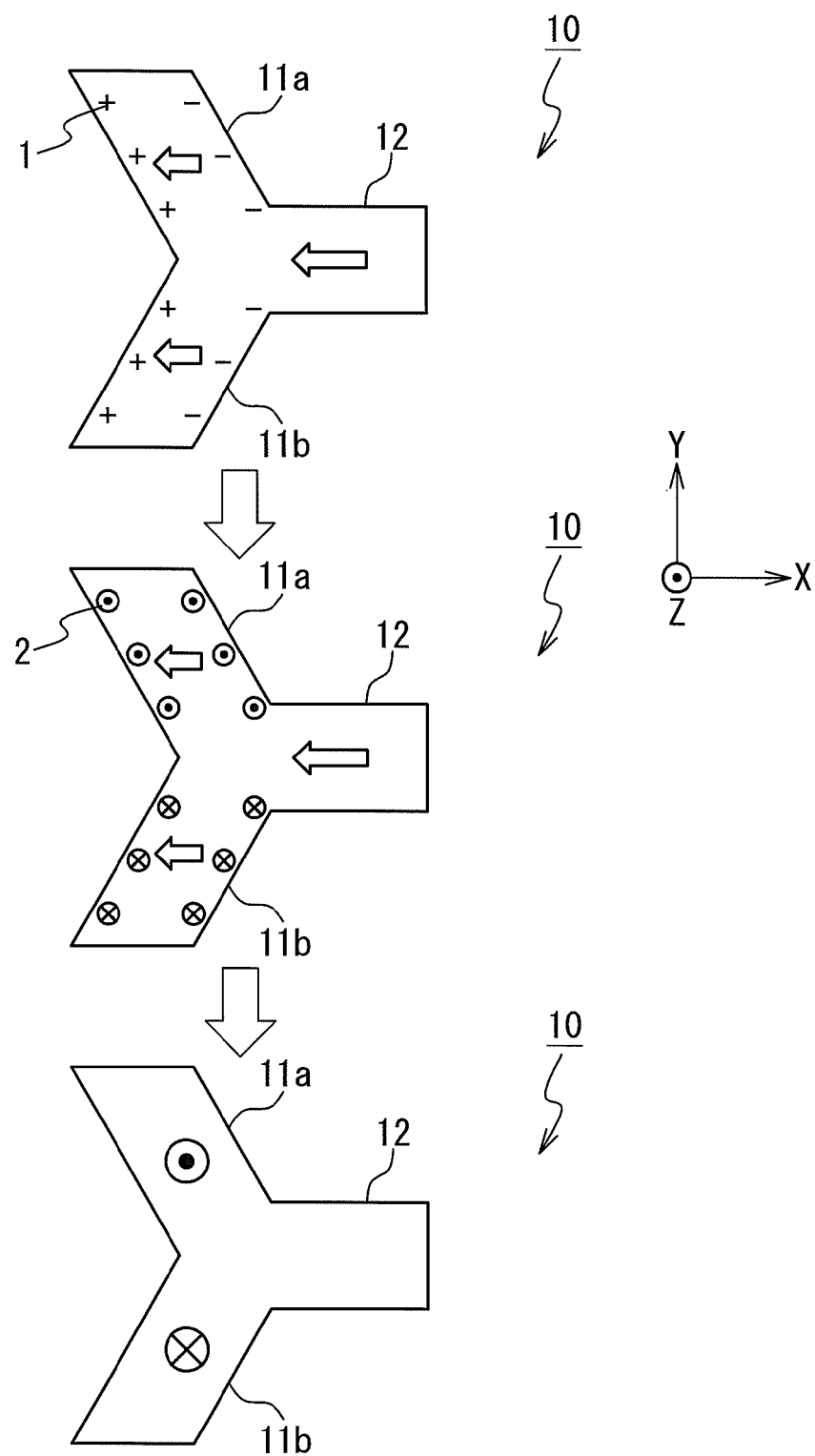
FIG. 13 is a conceptual diagram illustrating an initialization method for the fifth configuration example of the magnetoresistance effect element according to the exemplary embodiment of the present invention.

FIG. 13 is a conceptual diagram illustrating the initialization method for the fifth configuration example of the magnetoresistance effect element according to the exemplary embodiment of the present invention. In the fifth configuration example, a uniform and sufficiently large external magnetic field is first applied in the −x direction. At this time, as indicated by arrows in an upper diagram of FIG. 13, the first ferromagnetic layer 10 is brought into a state where the magnetization thereof is saturated in the −x direction. At edges of the first ferromagnetic layer 10, magnetic poles 1 are generated. Then, the external magnetic field is decreased to zero. At this time, as illustrated in a middle diagram of FIG. 13, due to diamagnetic fields generated by the magnetic poles 1, torques 2 act on the magnetization of the first ferromagnetic layer 10. Note that the torques 2 are antiparallel to each other between the first magnetization pinned region 11a and the second magnetization pinned region 11b. When such torques 2 act, the magnetizations rotate in the same directions as the torques 2 because the first ferromagnetic layer 10 has the magnetic anisotropy in the direction perpendicular to the film surface. As a result, as illustrated in a lower diagram of FIG. 13, the magnetizations of the first magnetization pinned region 11a and the second magnetization pinned region 11b is oriented in directions antiparallel to each other.

In the fifth configuration example, if the torques 2 acting in the first magnetization pinned region 11a and the second magnetization pinned region 11b due to the diamagnetic fields, which are illustrated in a middle diagram of FIG. 13, are antiparallel to each other, the first ferromagnetic layer 10 may have any shape. Also, in the middle diagram of FIG. 13, there is illustrated the example where a direction of the external magnetic field is the −x direction; however, another direction may be used.

Further, in the initialization process in the fifth configuration example illustrated in FIG. 13, a magnetization direction of the magnetization free region 12 after the initialization is not fixed. However, by patterning in an oblique direction an edge of the other end (on the side opposite to the side connected to the first magnetization pinned region 11a and the second magnetization pinned region 11b) of the magnetization free region 12, the magnetization direction of the magnetization free region 12 after the initialization can also be fixed.

Regarding the above-described respective configuration examples, at least two of them can also be used in combination unless a contradiction arises between them.

First Variation Example

FIGS. 14A to 14C, 15A to 15C, and 16A to 16D are plan views schematically illustrating structures in a first variation example of the magnetoresistance effect element according to the exemplary embodiment of the present invention. The first variation example illustrated in these diagrams is related to an xy-planar shape of the first ferromagnetic layer 10.

Figure 14A:
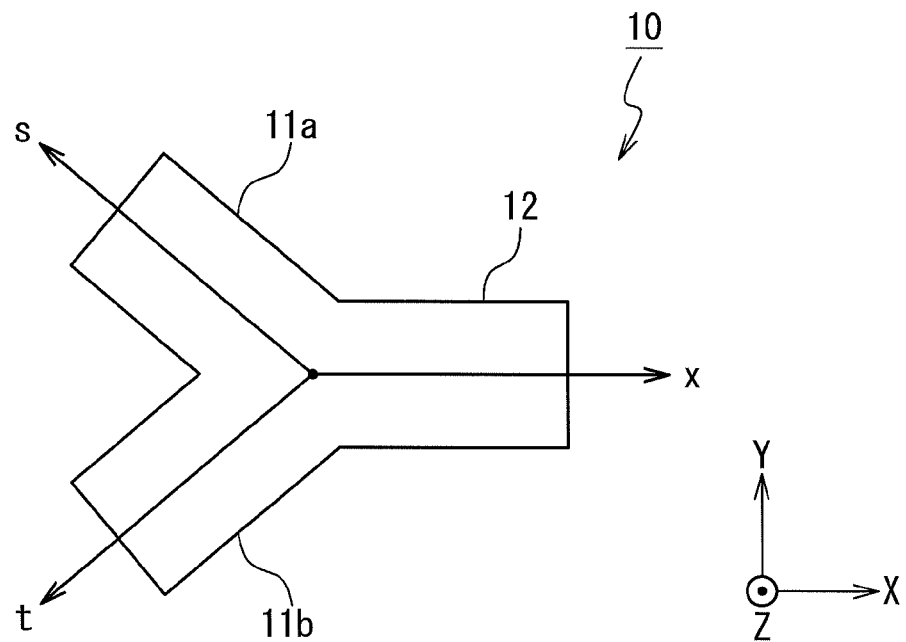
FIG. 14A is a plan view schematically illustrating a structure in a first variation example of the magnetoresistance effect element according to the exemplary embodiment of the present invention.
Figure 14B:
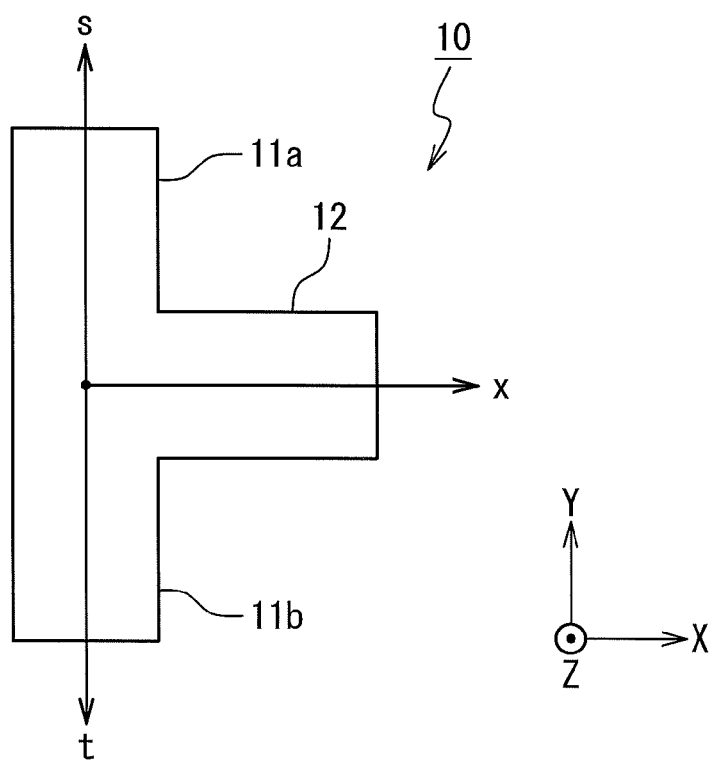
FIG. 14B is a plan view schematically illustrating a structure in the first variation example of the magnetoresistance effect element according to the exemplary embodiment of the present invention.
Figure 14C:
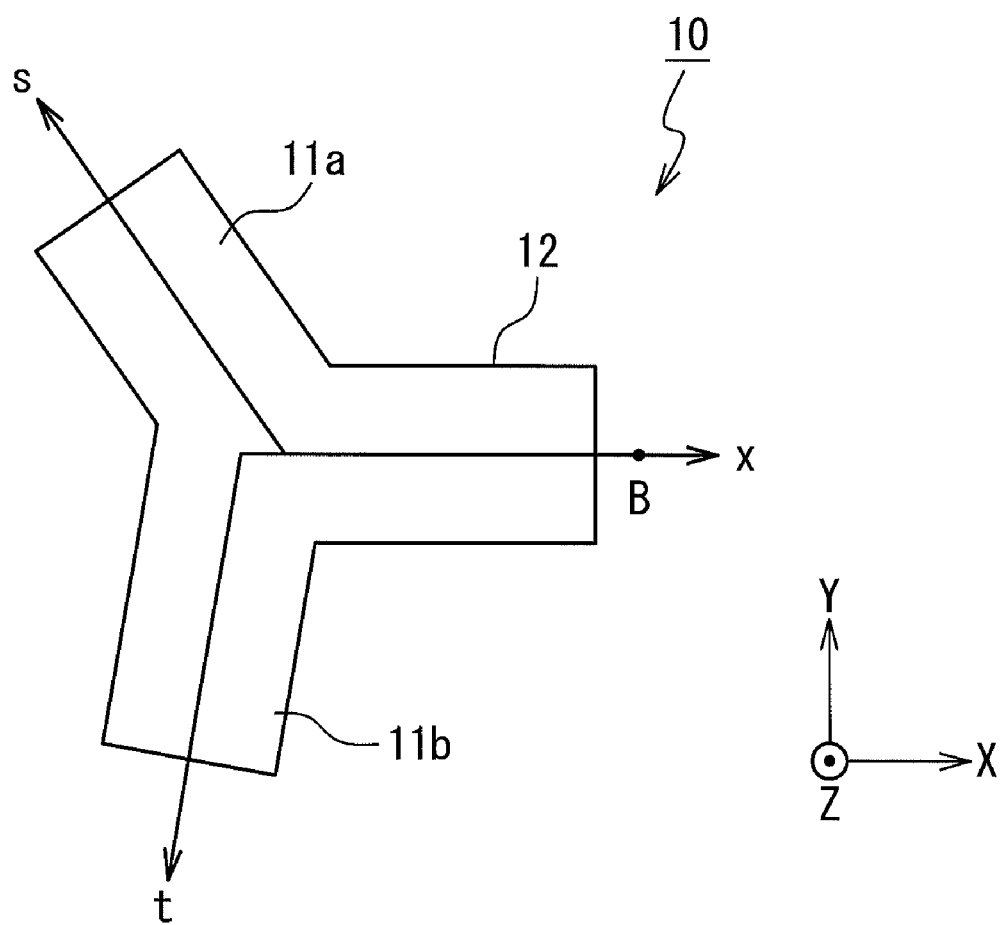
FIG. 14C is a plan view schematically illustrating a structure in the first variation of the magnetoresistance effect element according to the exemplary embodiment of the present invention.

In FIGS. 14A to 14C, variation examples on an angle formed between the longer directions of the first magnetization pinned region 11a and the second magnetization pinned region 11b are illustrated. In FIG. 1B, any of angles formed among the x direction that is the longer direction of the magnetization free region 12, the s direction that is the longer direction of the first magnetization pinned region 11a, and the t direction that is the longer direction of the second magnetization pinned region 11b is illustrated as approximately 120 degrees. However, these angles may have any relationship with one another. For example, as illustrated in FIG. 14A, the angle formed between the s direction and the t direction may be small as compared with the other angles. Also, as illustrated in FIG. 14B, the angle formed between the s direction and the t direction may be large as compared with the other angles. Further, as illustrated in FIG. 14C, the angles formed between the s direction and the x direction and between the t direction and the x direction may be different from each other.

Figure 15A:
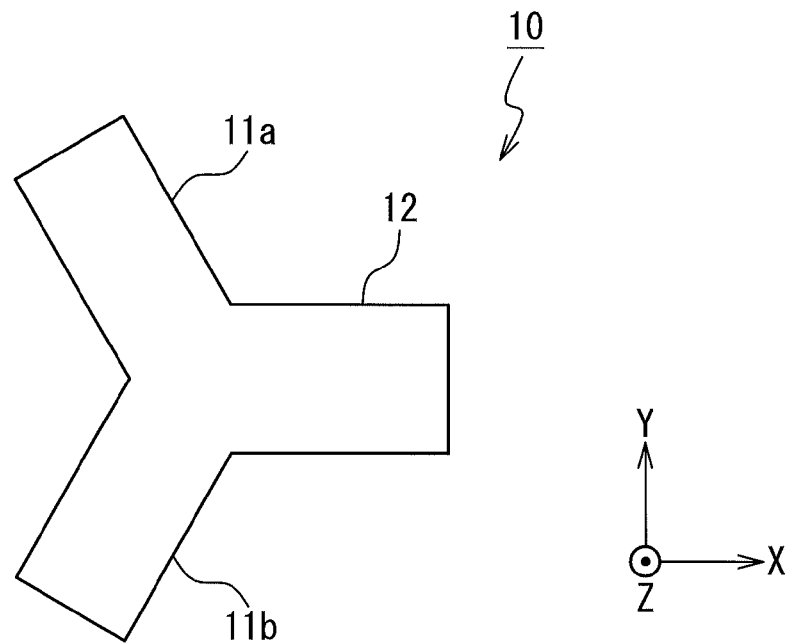
FIG. 15A is a plan view schematically illustrating a structure in the first variation example of the magnetoresistance effect element according to the exemplary embodiment of the present invention.
Figure 15B:
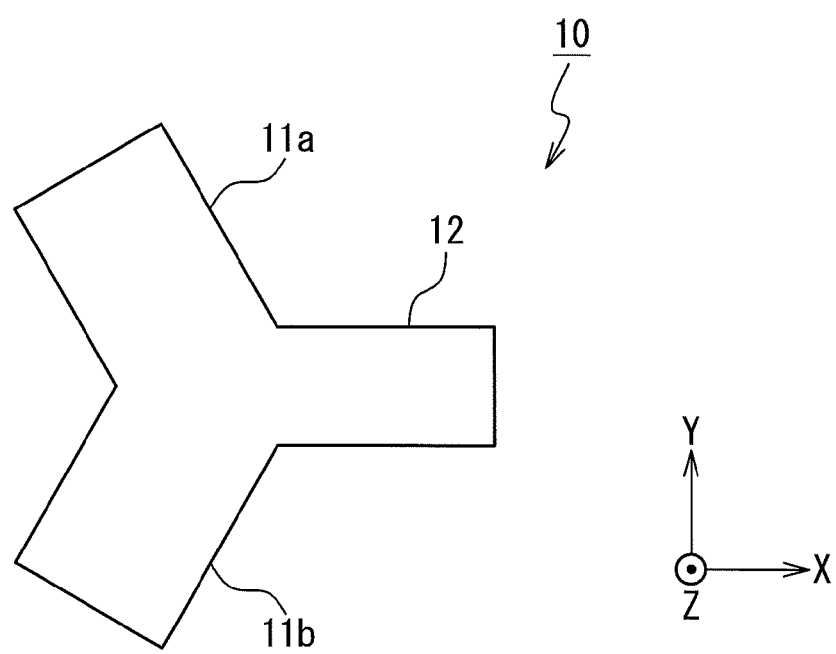
FIG. 15B is a plan view schematically illustrating a structure in the first variation example of the magnetoresistance effect element according to the exemplary embodiment of the present invention.
Figure 15C:
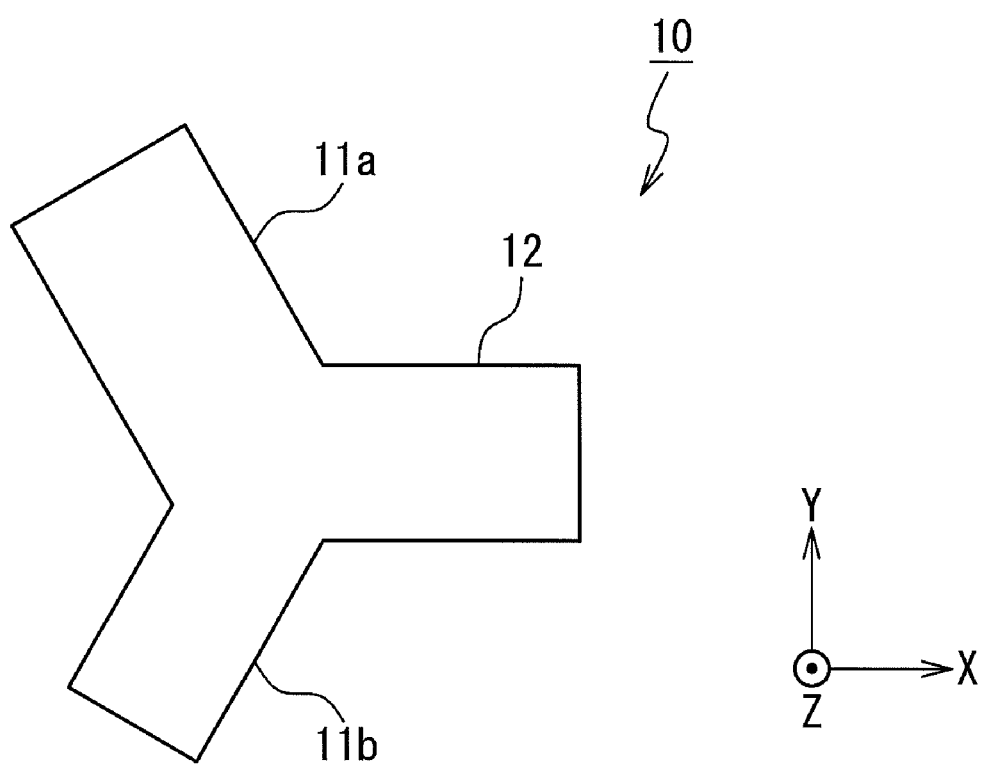
FIG. 15C is a plan view schematically illustrating a structure in the first variation example of the magnetoresistance effect element according to the exemplary embodiment of the present invention.

In FIGS. 15A to 15C, variation examples on widths of the magnetization free region 12, and the first magnetization pinned region 11a and the second magnetization pinned region 11b are illustrated. In FIG. 1B, the widths of the magnetization free region 12, and the first magnetization pinned region 11a and the second magnetization pinned region 11b are all equally illustrated. However, these widths may have any relationship with one another. For example, as illustrated in FIG. 15A, the widths of the first magnetization pinned region 11a and the second magnetization pinned region 11b may be narrow as compared with that of the magnetization free region 12. On the other hand, as illustrated in FIG. 15B, the widths of the first magnetization pinned region 11a and the second magnetization pinned region 11b may be wide as compared with that of the magnetization free region 12. Alternatively, as illustrated in FIG. 15C, the widths of the magnetization free region 12, and the first magnetization pinned region 11a and the second magnetization pinned region 11b may be different from one another.

Figure 16A:
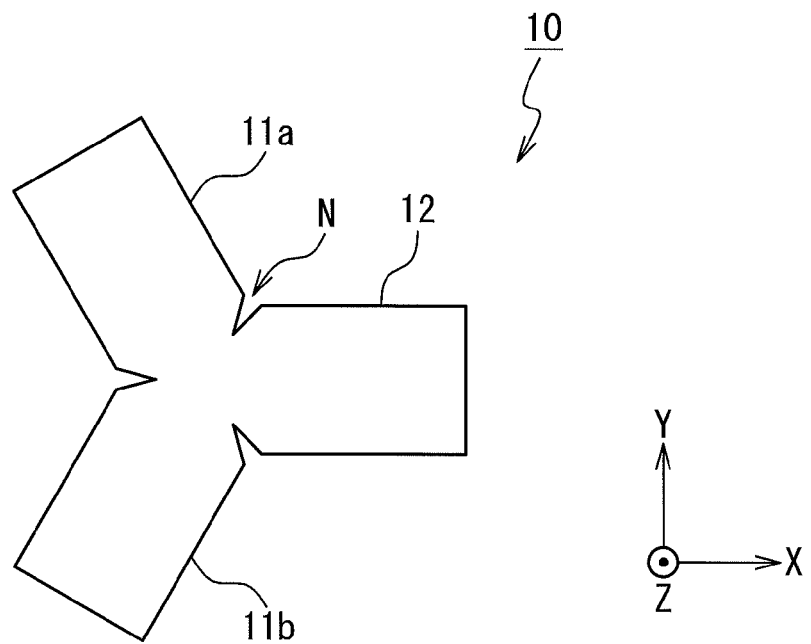
FIG. 16A is a plan view schematically illustrating a structure in the first variation example of the magnetoresistance effect element according to the exemplary embodiment of the present invention.

In FIGS. 16A to 16D, variation examples each in which a modulation of a planar shape is provided to the first ferromagnetic layer are illustrated. In FIG. 1B, the first ferromagnetic layer 10 has a shape substantially consisting of three rectangles; however, a shape of the first ferromagnetic layer 10 necessary to carry out the present invention is arbitrary. For example, as illustrated in FIG. 16A, between the first magnetization pinned region 11a and the second magnetization pinned region 11b, between the second magnetization pinned region 11b and the magnetization free region 12, and between the magnetization free region 12 and the first magnetization pinned region 11a, notches (constrictions) N may be provided. By providing the notches N, an area of the domain wall in a static state is decreased, and therefore a pinning potential for the domain wall is increased. In addition, upon writing, a current density at a pinning site for the domain wall is increased, so that thermal stability is improved and also a current density necessary for depinning is reduced.

Figure 16B:
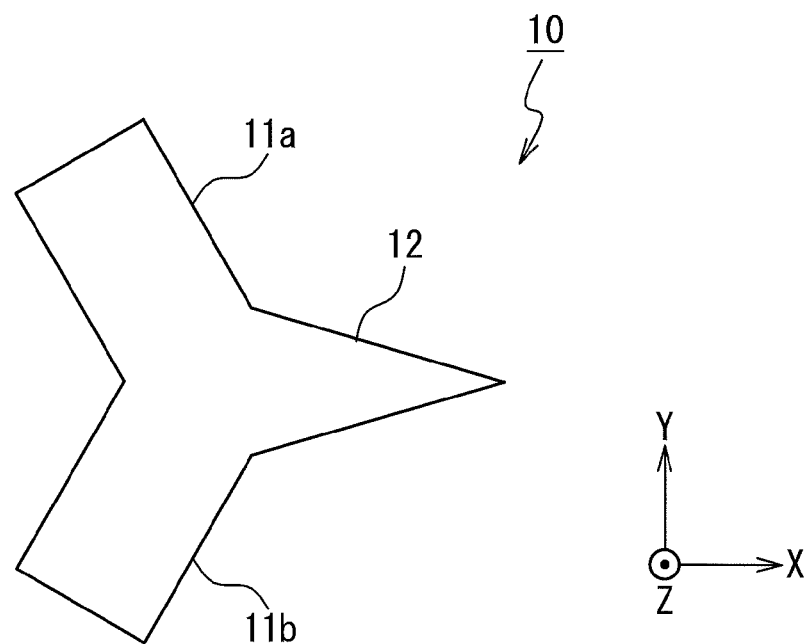
FIG. 16B is a plan view schematically illustrating a structure in the first variation example of the magnetoresistance effect element according to the exemplary embodiment of the present invention.

Also, as illustrated in FIG. 16B, the width of the magnetization free region 12 may be formed so as to narrow toward the side opposite to the first magnetization pinned region 11a and the second magnetization pinned region 11b. In the case of forming the width of the magnetization free region 12 in this manner, the domain wall depinned from a pinning site upon write operation attempts to move in a direction in which the area of the domain wall decreases, so that the domain wall easily passes through the end part (on the side opposite to the magnetization pinned regions 11) of the magnetization free region 12, and therefore writing can be more easily performed.

Figure 16C:
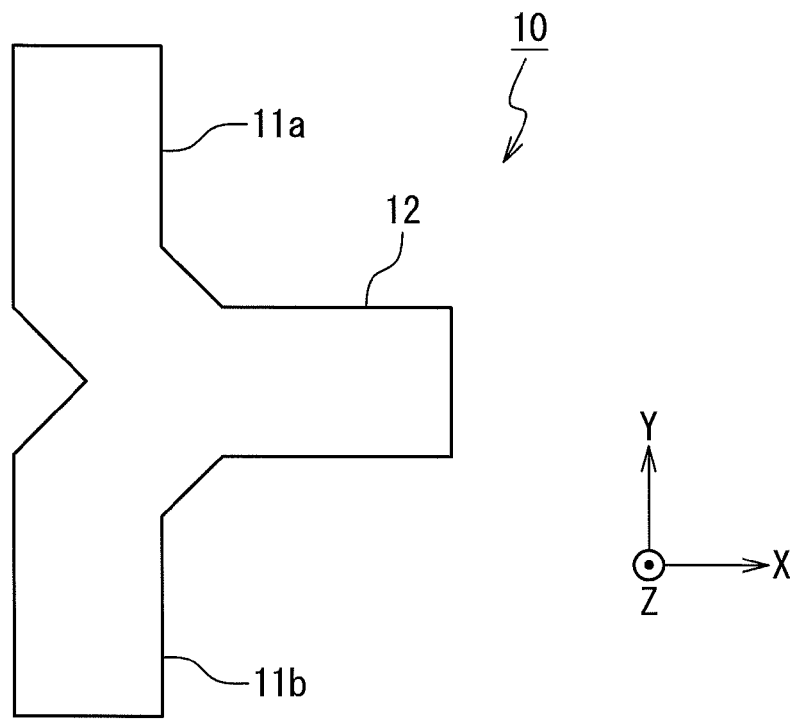
FIG. 16C is a plan view schematically illustrating a structure in the first variation example of the magnetoresistance effect element according to the exemplary embodiment of the present invention.

Further, as illustrated in FIG. 16C, the first magnetization pinned region 11a and the second magnetization pinned region 11b, and magnetization free region 12 may be folded, or gradually bent. Note that FIG. 16C illustrates an example where the first magnetization pinned region 11a and the second magnetization pinned region 11b are folded. However, the other combinations may be used. In particular, in the case of initializing the first ferromagnetic layer 10 by the initializing method as illustrated in FIG. 8 or 10, a desired initialization process can be more stably achieved by adjusting shapes of the respective regions.

Figure 16D:
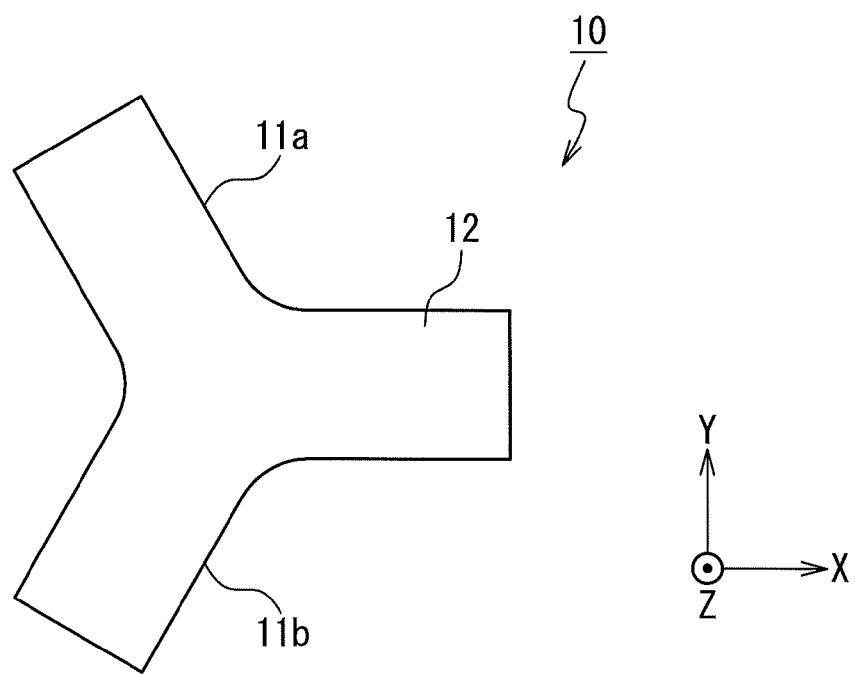
FIG. 16D is a plan view schematically illustrating a structure in the first variation example of the magnetoresistance effect element according to the exemplary embodiment of the present invention.

Still further, as illustrated in FIG. 16D, the first magnetization pinned region 11a and the second magnetization pinned region 11b, and magnetization free regions 12 may be formed so as to smoothly connect to one another. As described, by forming the first magnetization pinned region 11a and the second magnetization pinned region 11b, and the magnetization free regions 12 so as to smoothly connect to one another, a local increase in current density upon introduction of write current can be avoided. This enables operational stability, reliability, and element lifetime to be improved.

Second Variation Example

FIGS. 17A, 17B, 18, and 19A to 19C are plan views schematically illustrating structures in a second variation example of the magnetoresistance effect element according to the exemplary embodiment of the present invention. The second variation example is related to sizes and the number of the third ferromagnetic layers 15, and positional relationships of the third ferromagnetic layers 15 with the first ferromagnetic layer 10. Note that, in each of these diagrams, as described with use of FIGS. 6, 7A to 7C, and 9A to 9C, the case where two or more third ferromagnetic layers 15 are provided adjacent to the first magnetization pinned region 11a and the second magnetization pinned region 11b is illustrated. However, the present variation example can also be applied to another configuration, for example, the case where the third ferromagnetic layer 15 is adjacent to any one of the first magnetization pinned region 11a and the second magnetization pinned region 11b, or the other case.

Figure 17A:
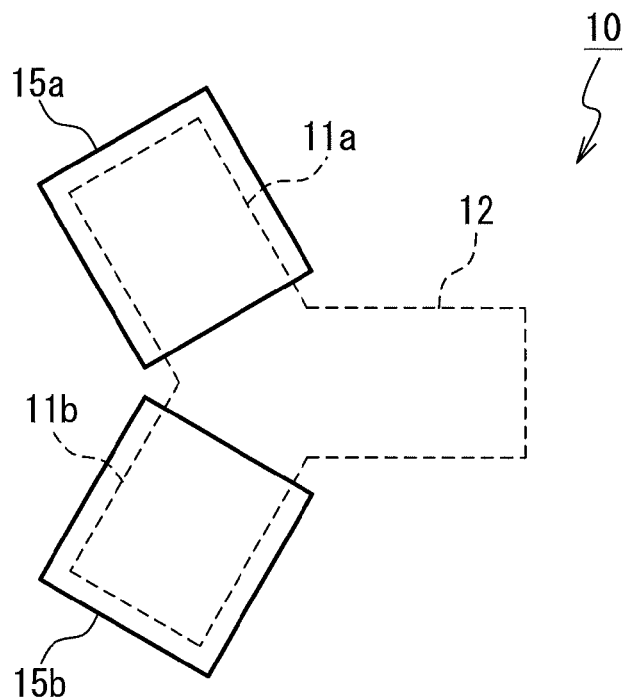
FIG. 17A is a plan view schematically illustrating a structure in a second variation example of the magnetoresistance effect element according to the exemplary embodiment of the present invention.
Figure 17B:
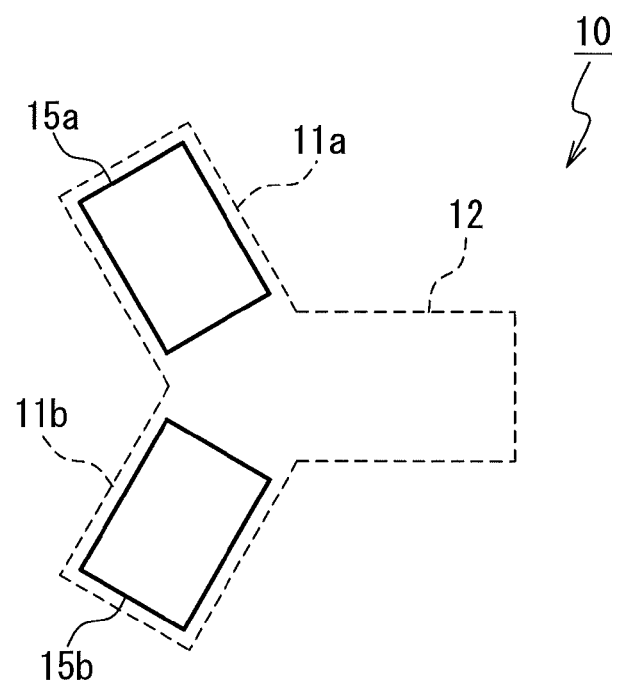
FIG. 17B is a plan view schematically illustrating a structure in the second variation example of the magnetoresistance effect element according to the exemplary embodiment of the present invention.

In FIGS. 17A and 17B, variation examples on a size of the third ferromagnetic layer 15 are illustrated. In the magnetoresistance effect element 80, the third ferromagnetic layer 15 may have any size. For example, as illustrated in FIG. 17A, the third ferromagnetic layers 15 may be formed large as compared with the first magnetization pinned region 11a and the second magnetization pinned region 11b. Also, as illustrated in FIG. 17B, the third ferromagnetic layers 15 may be formed small as compared with the first magnetization pinned region 11a and the second magnetization pinned region 11b. Further, in the diagrams, a shape of the third ferromagnetic layer 15 is illustrated as a rectangle; however, a shape of the third ferromagnetic layer 15 may be any shape such as a circle, ellipsoid, square, or polygon. Still further, sizes and shapes of the first third ferromagnetic layer 15a and the second third ferromagnetic layer 15b may be different from each other. Yet further, the first or second third ferromagnetic layer 15a or 15b may cover an entire or partial area of the first or second magnetization pinned region 11a or 11b in the xy-plane.

Figure 18:
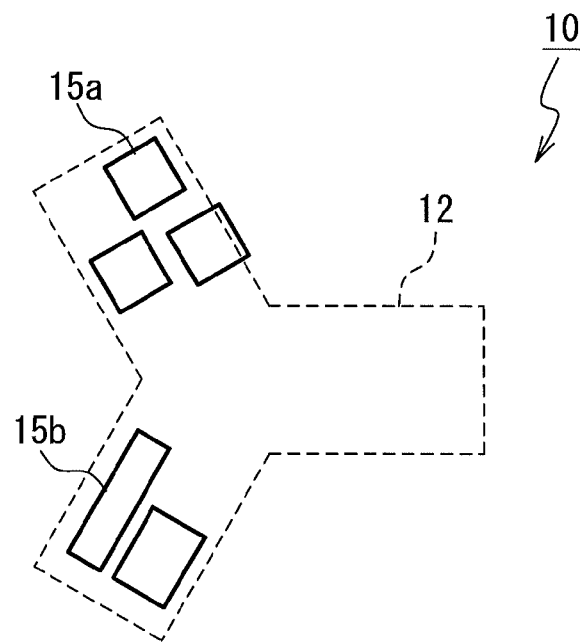
FIG. 18 is a plan view schematically illustrating a structure in the second variation example of the magnetoresistance effect element according to the exemplary embodiment of the present invention.

In FIG. 18, a variation example on sizes and the number of the third ferromagnetic layers 15 is illustrated. In the magnetoresistance effect element 80, sizes and the number of the third ferromagnetic layers 15 are arbitrary. For example, as illustrated in FIG. 18, two or more third ferromagnetic layers 15 may be provided. Also, sizes, shapes, and the numbers of the first third ferromagnetic layers 15*a* and second third ferromagnetic layers 15 may be mutually different.

Figure 19A:
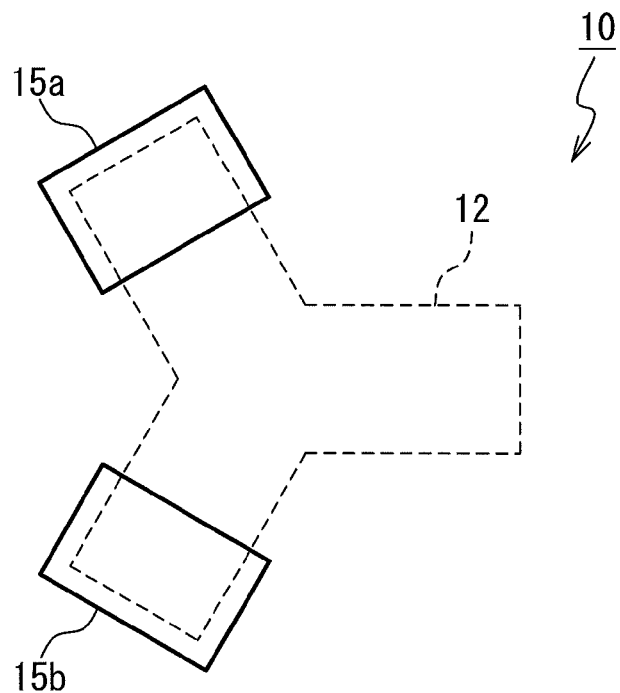
FIG. 19A is a plan view schematically illustrating a structure in the second variation example of the magnetoresistance effect element according to the exemplary embodiment of the present invention.
Figure 19B:
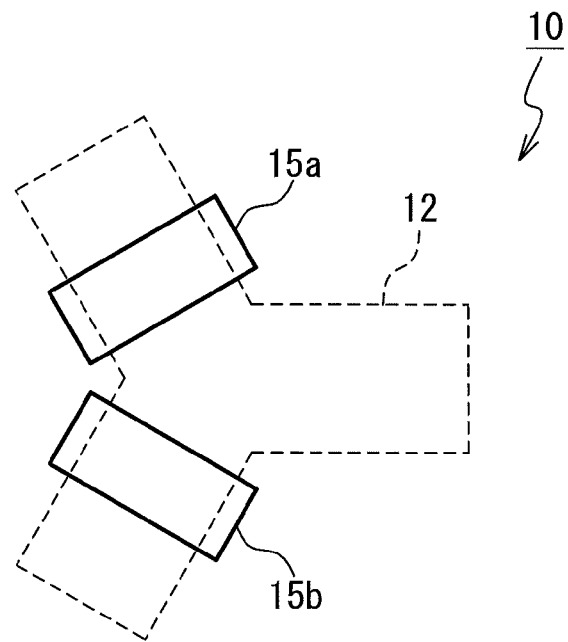
FIG. 19B is a plan view schematically illustrating a structure in the second variation example of the magnetoresistance effect element according to the exemplary embodiment of the present invention.
Figure 19C:
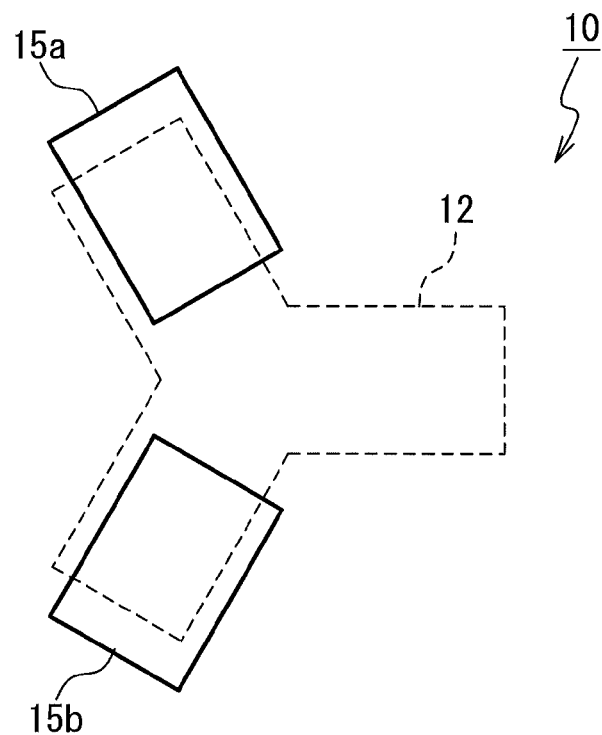
FIG. 19C is a plan view schematically illustrating a structure in the second variation example of the magnetoresistance effect element according to the exemplary embodiment of the present invention.

In FIGS. 19A to 19C, variation examples on a positional relationship between the third ferromagnetic layers 15 and the first ferromagnetic layer 10 are illustrated. That is, the positional relationship between the third ferromagnetic layers 15 and the first ferromagnetic layer 10 is also arbitrary. For example, as illustrated in FIG. 19A, the third ferromagnetic layers 15 may be provided adjacent to only the end parts of the first magnetization pinned region 11*a* and the second magnetization pinned region 11*b*. Also, as illustrated in FIG. 19B, the third ferromagnetic layers 15 may be provided adjacent to only junction parts of the first magnetization pinned region 11*a* and the second magnetization pinned region 11*b*. Further, as illustrated in FIG. 19C, the third ferromagnetic layers 15 may be provided with centerlines thereof in their longer directions being displaced with respect to centerlines of the first magnetization pinned region 11*a* and the second magnetization pinned region 11*b*. Still further, the first third ferromagnetic layer 15*a* and the second third ferromagnetic layer 15*b* may be provided to respectively have different relationships with the first magnetization pinned region 11*a* and the second magnetization pinned region 11*b*. Besides, the third ferromagnetic layers 15 are only required to be magnetically coupled to the first ferromagnetic layer 10, but may be electrically isolated from the first ferromagnetic layer 10.

Third Variation Example

Figure 20A:
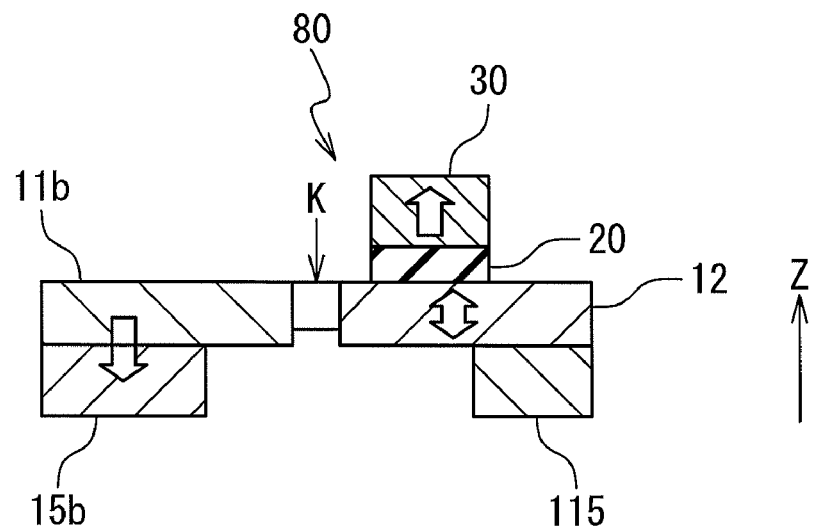
FIG. 20A is a cross-sectional view schematically illustrating a structure in a third variation example of the magnetoresistance effect element according to the exemplary embodiment of the present invention.
Figure 20B:
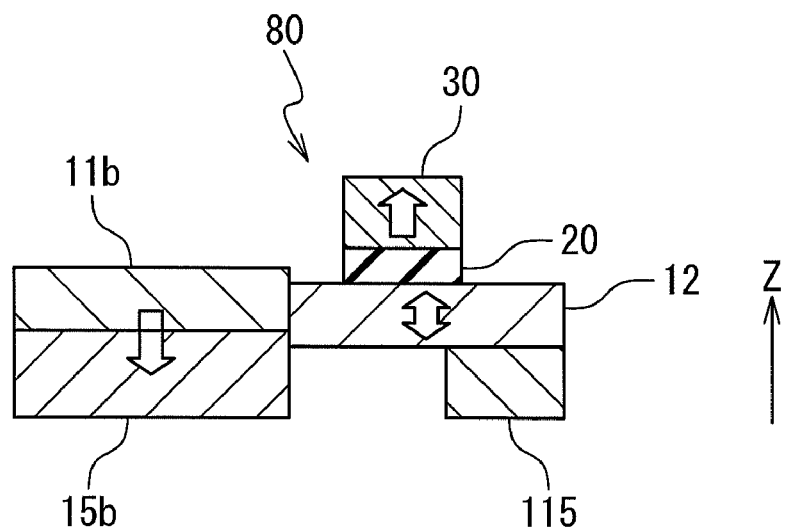
FIG. 20B is a cross-sectional view schematically illustrating a structure in the third variation example of the magnetoresistance effect element according to the exemplary embodiment of the present invention.

FIGS. 20A and 20B are cross-sectional views schematically illustrating structures in a third variation example of the magnetoresistance effect element according to the exemplary embodiment of the present invention. The third variation example is related to cross-sectional shapes of the first and third ferromagnetic layers 10 and 15. Note that each of FIGS. 20A and 20B illustrates the case where the third ferromagnetic layer 15 is provided adjacent to the first ferromagnetic layer 10. However, as described above, even in the case where the third ferromagnetic layer 15 is omitted, the present variation example can be applied.

In the magnetoresistance effect element 80 according to the present invention, the cross-sectional shapes of the first and third ferromagnetic layers 10 and 15 are arbitrary. For example, as illustrated in FIG. 20A, the first ferromagnetic layer 10 may be provided with a constriction K in a cross section thereof. In particular, as illustrated in FIG. 20A, in the case where the constriction K is provided at the boundary part between the magnetization pinned region (in the example of the diagram, the second magnetization pinned region 11*b*) and the magnetization free region 12, which serves as the pinning site for the domain wall, the pinning potential for the domain wall is increased, and also a current density is locally increased upon depinning, so that thermal stability is improved, and also a current density necessary for depinning is reduced. Note that FIG. 20A illustrates the example where the constriction is provided on a lower surface of the first ferromagnetic layer 10. However, the constriction may be provided on the upper side, or the constrictions may be provided on the both sides. Alternatively, not the constriction but a projection may be cross-sectionally provided.

Also, FIG. 20B schematically illustrates another structure in the third variation example. As illustrated in FIG. 20B, the first ferromagnetic layer 10 may be provided with a step. In particular, as illustrated in FIG. 20B, in the case where the step is provided at the boundary part between the magnetization pinned region (in the example of the diagram, the second magnetization pinned region 11*b*) and the magnetization free region 12, which serves as the pinning site for the domain wall, the pinning potential for the domain wall is increased, and therefore thermal stability is improved.

Fourth Variation Example

Figure 21:
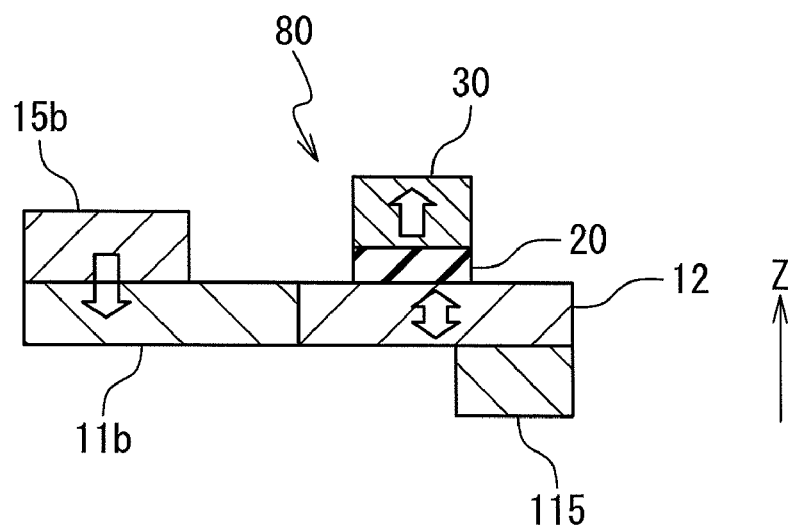
FIG. 21 is a cross-sectional view schematically illustrating a structure in a fourth variation example of the magnetoresistance effect element according to the exemplary embodiment of the present invention.
Figure 22:
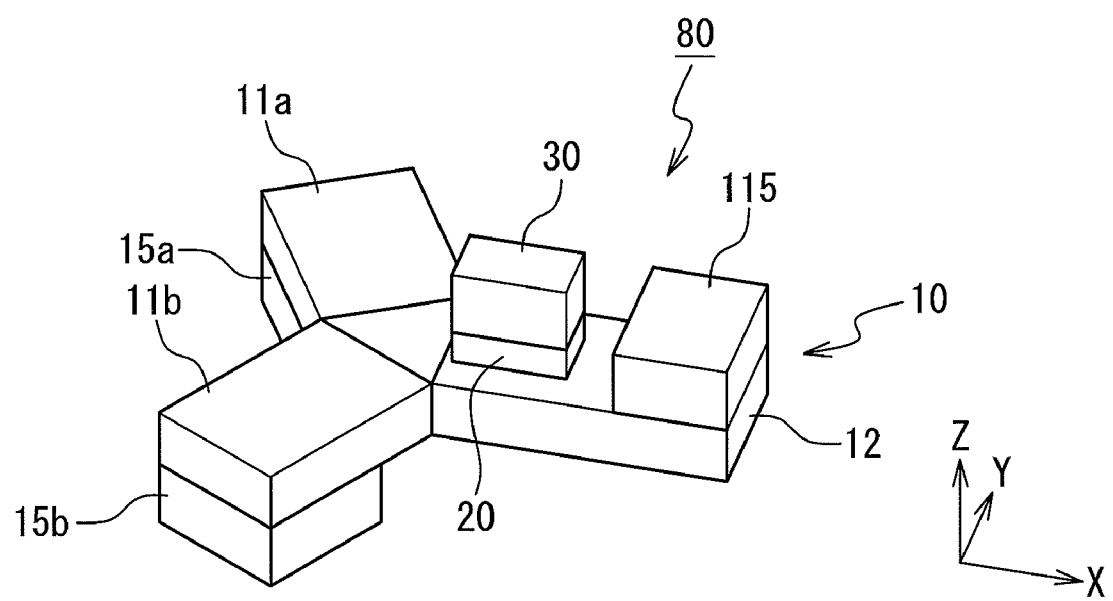
FIG. 22 is a perspective view schematically illustrating a structure in the fourth variation example of the magnetoresistance effect element according to the exemplary embodiment of the present invention.
Figure 23:
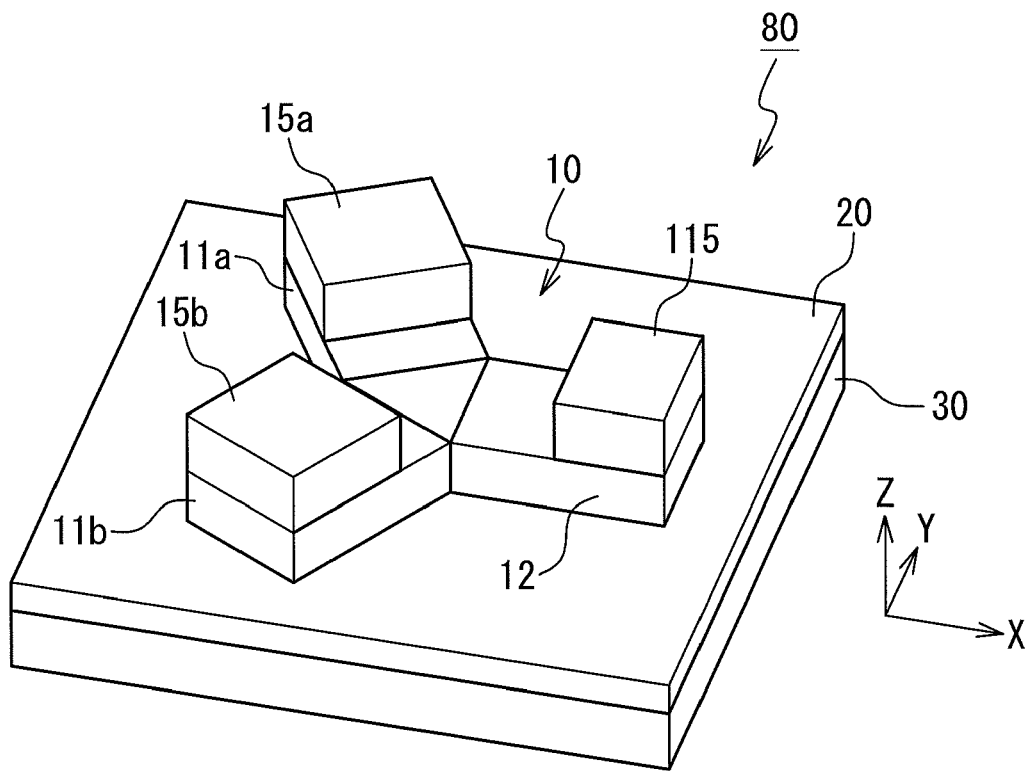
FIG. 23 is a perspective view schematically illustrating a structure in the fourth variation example of the magnetoresistance effect element according to the exemplary embodiment of the present invention.

FIGS. 21, and FIGS. 22 and 23 are a cross-sectional view and perspective views schematically illustrating structures in a fourth variation example of the magnetoresistance effect element according to the exemplary embodiment of the present invention. The fourth variation example is related to positional relationships of the third ferromagnetic layers 15, the electrode layer 115, and the second ferromagnetic layer 30 relative to the first ferromagnetic layer 10. FIGS. 1A and 1C illustrate the example where the third ferromagnetic layers 15 and the electrode layer 115 are provided on a lower side (in the −z direction) of the first ferromagnetic layer 10, whereas the second ferromagnetic layer 30 is provided on an upper side (in the +z direction) of the first ferromagnetic layer 10. However, in the present invention, the positional relationships of the third ferromagnetic layers 15, the electrode layer 115, and the second ferromagnetic layer 30 relative to the first ferromagnetic layer 10 are not limited to the example. That is, it is only necessary that the electrode layer 115 is provided adjacent to the first ferromagnetic layer, at least a part of the second ferromagnetic layer 30 is provided so as to be connected to at least a part of the magnetization free region 12 of the first ferromagnetic layer 10 through the insulating layer 20, and at least a part of the third ferromagnetic layer 15 is provided so as to be magnetically connected to at least a part of the first or second magnetization pinned region 11*a* or 11*b* of the first ferromagnetic layer 10, without limitation to the relative positional relationships in the example of FIGS. 1A and 1C.

For example, as illustrated in FIG. 21, the third ferromagnetic layer 15 may be provided on the upper side (in the +z direction) of the first ferromagnetic layer 10. Also, as illustrated in FIG. 22, the electrode layer 115 may be provided on the upper side (in the +z direction) of the first ferromagnetic layer 10. Further, as illustrated in FIG. 23, the insulating layer 20, and the second ferromagnetic layer 30 provided adjacent to the insulating layer 20 on a side opposite to the first ferromagnetic layer 10 may be provided on the lower side (in the −z direction) of the first ferromagnetic layer 10. Note that, as illustrated in FIG. 23, in the case where the second ferromagnetic layer 30 is formed in a sufficiently large shape as compared with the magnetization free region 12, influence of leakage flux from the second ferromagnetic layer 30 to the magnetization free region 12 is reduced, and a role as a heat sink can be played, so that a temperature rise of the first ferromagnetic layer 10 upon write operation can be prevented.

Fifth Variation Example

FIGS. 24, 25A, 25B, and 26A, and FIG. 26B are cross-sectional views and a perspective view schematically illustrating write current paths in a fifth variation example of the magnetoresistance effect element according to the exemplary embodiment of the present invention. In the magnetoresistance effect element 80 according to the present invention, the write current flows between the first magnetization pinned region 11*a* and the magnetization free region 12, or between the second magnetization pinned region 11b and the magnetization free region 12 to perform writing. The write current may be supplied from any path, and flow out through any path.

Figure 24:
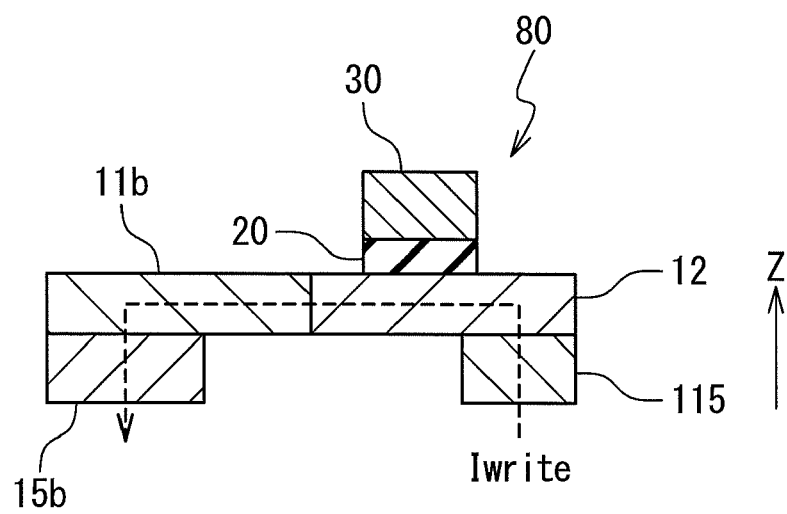
FIG. 24 is a cross-sectional view schematically illustrating a write current path in a fifth variation example of the magnetoresistance effect element according to the exemplary embodiment of the present invention.

FIG. 24 illustrates a first example of the write current path. In the first example, the write current supplied from the electrode layer 115 to the magnetization free region 12 passes through the magnetization pinned region 11, and then flows into an external wiring line through the third ferromagnetic layer 15. In this case, another electrode layer is desirably provided adjacent to the third ferromagnetic layer 15.

Figure 25A:
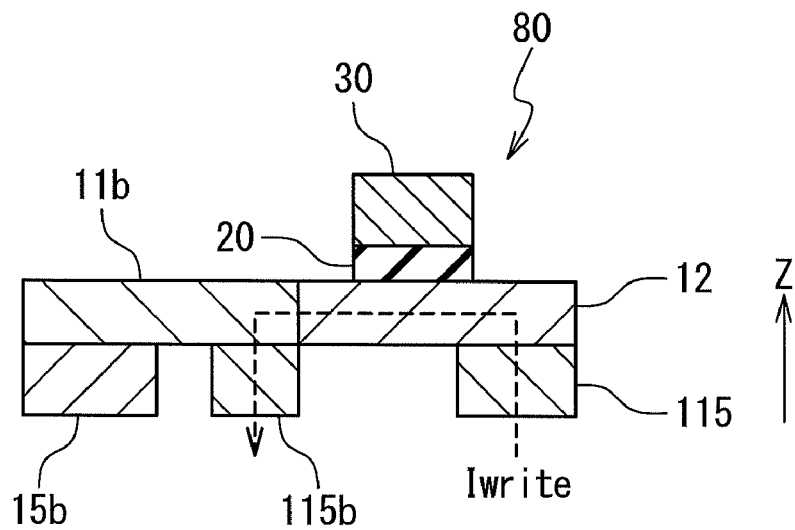
FIG. 25A is a cross-sectional view schematically illustrating a write current path in the fifth variation example of the magnetoresistance effect element according to the exemplary embodiment of the present invention.
Figure 25B:
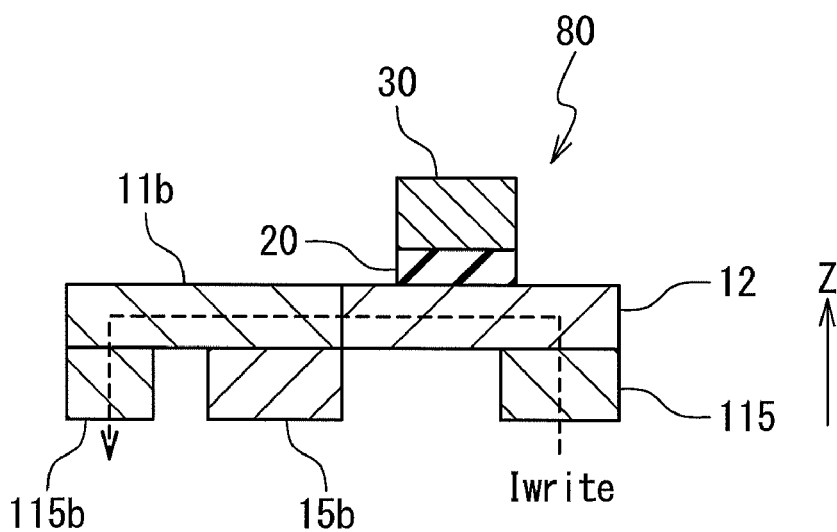
FIG. 25B is a cross-sectional view schematically illustrating a write current path in the fifth variation example of the magnetoresistance effect element according to the exemplary embodiment of the present invention.

FIGS. 25A and 25B illustrate a second example of the write current path. In the second example, the write current supplied from the electrode layer 115 to the magnetization free region 12 passes through the magnetization pinned region 11, and then flows into an external wiring line through another electrode layer 115. Note that FIG. 25 illustrates a second electrode layer 115b adjacent to the second magnetization pinned region 11b; however, in the same manner, a first electrode layer 115a is provided adjacent to the first magnetization pinned region 11a. In this case, the third ferromagnetic layer 15 may or may not be provide. Also, in the case of providing the third ferromagnetic layer 15, as illustrated in FIG. 25A, the third ferromagnetic layer 15 may be provided on an outer side of the electrode layer 115, or as illustrated in FIG. 25B, on an inner side of the electrode layer 115.

Figure 26A:
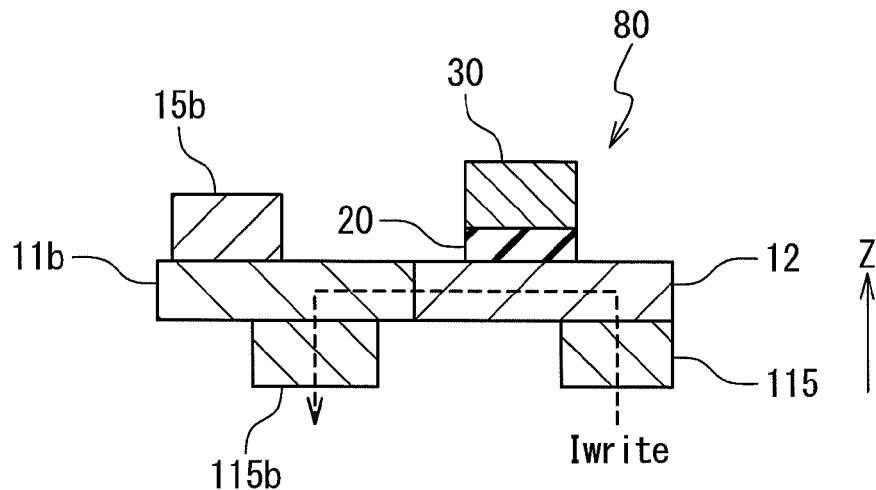
FIG. 26A is a cross-sectional view schematically illustrating a write current path in the fifth variation example of the magnetoresistance effect element according to the exemplary embodiment of the present invention.
Figure 26B:
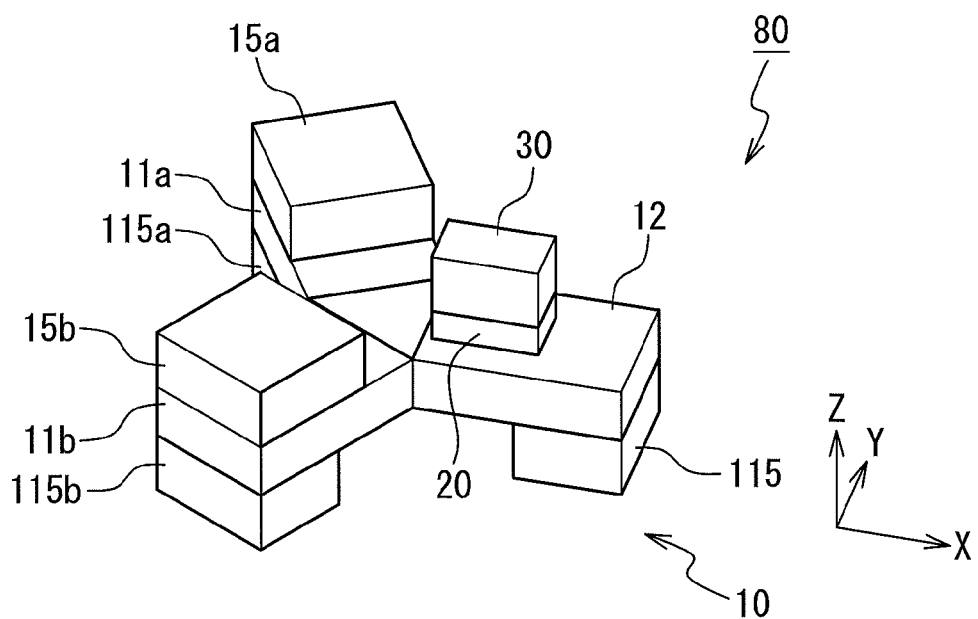
FIG. 26B is a perspective view schematically illustrating a write current path in the fifth variation example of the magnetoresistance effect element according to the exemplary embodiment of the present invention.

FIGS. 26A and 25B also illustrate a variation example of the second example. FIGS. 26A and 26B respectively illustrate a cross-sectional view and perspective view of the variation example. Even in FIGS. 26A and 26B, the write current does not include the third ferromagnetic layer 15 in its path. Also, in FIGS. 26A and 26B, the third ferromagnetic layer (in the example of the diagram, the second third ferromagnetic layer 15b) and electrode layer (in the example of the diagram, the second electrode layer 115b) are respectively provided on different surfaces of the magnetization pinned region (in the example of the diagram, the second magnetization pinned region 11b). In the case of FIGS. 26A and 26B, the electrode layer 115 (in the example of the diagram, the second electrode layer 115b) and the third ferromagnetic layer 15 (in the example of the diagram, the second third ferromagnetic layer 15b) can be provided so as to overlap with each other in the xy-plane, and therefore a cell area can be reduced, as compared with the case of FIGS. 25A and 25B.

Also, as described with use of FIGS. 7A to 7C, and 8, in the case of using the material having the magnetic anisotropy in the film surface longer side direction as the third ferromagnetic layer 15, the second example as illustrated in FIGS. 25A, 26A, and 26B is preferable. This is because, in the case where the write current passes through the third ferromagnetic layer 15 as in the first example as illustrated in FIG. 24, or in the case where the write current passes just above the third ferromagnetic layer 15 as in FIG. 25B, conduction electrons contributing the domain wall drive are supplied to the first ferromagnetic layer 10 with containing a spin-polarized component in the film surface longer side direction, which may influence magnetic moment of the first ferromagnetic layer, and therefore a write current margin is substantially limited.

Also, in the case where the write current does not pass through the third ferromagnetic layer 15 as illustrated in FIGS. 25A, 25B, 26A, and 26B, the third ferromagnetic layer 15 and the first ferromagnetic layer 10 are only required to be magnetically coupled to each other, and therefore may be electrically isolated from each other. Accordingly, the third ferromagnetic layer 15 may be shared between different bits.

Sixth Variation Example

Figure 27:
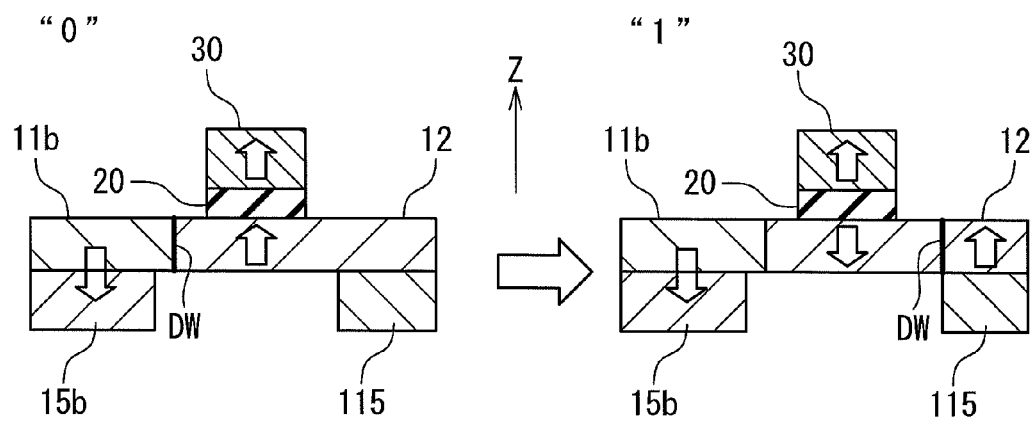
FIG. 27 is a cross-sectional view schematically illustrating a write method in a sixth variation example of the magnetoresistance effect element according to the exemplary embodiment of the present invention.

FIG. 27 is a cross-sectional view schematically illustrating a write method in a sixth variation example of the magnetoresistance effect element according to the exemplary embodiment of the present invention. Writing in the magnetoresistance effect element 80 according to the present invention is performed by supplying a current between the first magnetization pinned region 11a and the magnetization free region 12, or between the second magnetization pinned region 11b and the magnetization free region 12 thereby moving the domain wall (DW) formed at the boundary between the first magnetization pinned region 11a and the magnetization free region 12, or between the second magnetization pinned region 11b and the magnetization free region 12. Note that, at this time, in the magnetization free region 12, the domain wall (DW) is only required to pass over an overlap region with the second ferromagnetic layer 30 in the xy-plane. Accordingly, as illustrated in FIG. 2, upon writing, the domain wall may be completely passed through the end part of the magnetization free region 12; however, as illustrated in a right-hand side diagram of FIG. 27, the domain wall may be left without being passed through. Note that FIG. 27 illustrates the example where the domain wall stops near a boundary between the magnetization free region 12 and the electrode layer 115; however, a position at which the domain wall stops may be anywhere as long as the domain wall passes over the overlap region with the second ferromagnetic layer 30.

Also, to effectively stop the domain wall, a pinning site for the domain wall may be provided on an outer side (right-hand side in the diagram) of the overlap region with the second ferromagnetic layer 30 in the magnetization free region 12. To form the pinning site for the domain wall, the notch N, step, constriction K, or the like as described above can be used, although not illustrated. Further, the method providing a modulation of a planar shape to the magnetization free region 12 can also be used. For example, by increasing the width of the magnetization free region 12 at its end part to decrease a current density, the domain wall can be stopped at a position at which the width of the magnetization free region 12 increases.

Seventh Variation Example

Figure 28A:
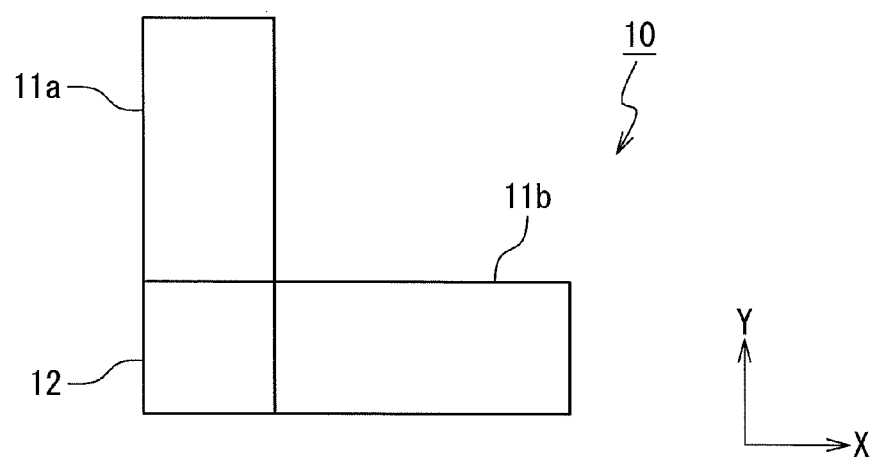
FIG. 28A is a plan view schematically illustrating a structure in a seventh variation example of the magnetoresistance effect element according to the exemplary embodiment of the present invention.
Figure 28B:
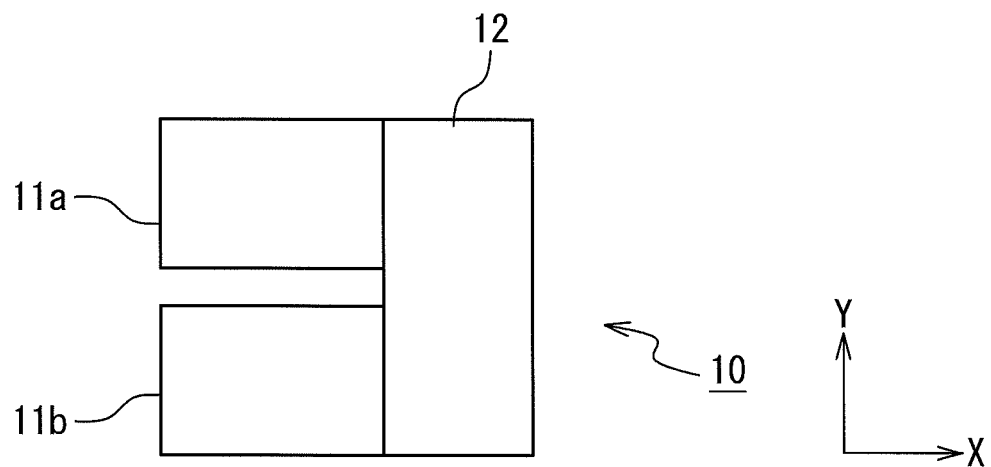
FIG. 28B is a plan view schematically illustrating a structure in the seventh variation example of the magnetoresistance effect element according to the exemplary embodiment of the present invention.
Figure 28C:
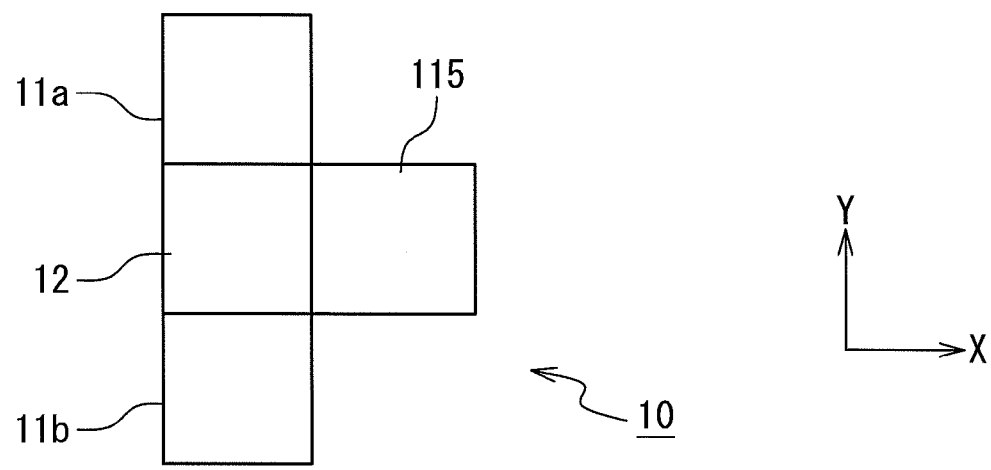
FIG. 28C is a plan view schematically illustrating a structure in the seventh variation example of the magnetoresistance effect element according to the exemplary embodiment of the present invention.

FIGS. 28A to 28C are plan views schematically illustrating structures in a seventh variation example of the magnetoresistance effect element according to the exemplary embodiment of the present invention. As described in the first variation example, the shape of the first ferromagnetic layer 10 according to the present invention is arbitrary; however, in the seventh variation example, such arbitrary property is further extended. That is, the first variation example defines that the first ferromagnetic layer 10 is formed in the "junction of three roads" shape. However, in the present invention, the first magnetization pinned region 11a and the second magnetization pinned region 11b are only required to be both connected to a part of the magnetization free region 12, and a positional relationship among them is arbitrary. Accordingly, as illustrated in FIGS. 28A and 28B, the present invention can also be carried out without forming the "junction of three roads" shape. Further, as illustrated in FIG. 28C, the electrode layer 115 may provided in the same layer as the first ferromagnetic layer 10, and the write current may be supplied through a path from the first magnetization pinned region 11a or the second magnetization pinned region 11b to the electrode layer 115 through the magnetization free region 12 to thereby perform writing.

Regarding to the above-described respective variation examples, at least two of them can also be used in combination unless a contradiction arises between them.

As an application example of the magnetic random access memory and magnetoresistance effect element of the present invention, a nonvolatile semiconductor storage device used for a cellular phone, a mobile personal computer, or a PDA, or a microcomputer incorporating a nonvolatile memory used for an automobile or the like is exemplified.

In the present invention, the first ferromagnetic layer in which the current-driven domain wall motion occurs is formed of a material having the magnetic anisotropy in the film surface perpendicular direction. This enables even a small current density to drive the domain wall on the basis of the effect represented by the spin torque term of the LLG equation taking into account the spin polarized current. At this time, the domain wall can be moved with little influence from the threshold magnetic field, and therefore a current required for writing can be reduced with keeping high thermal stability and disturbance magnetic field resistance. In particular, by decreasing a film thickness, a threshold current density for the domain wall drive by the spin torque term can be reduced. For this reason, a write current density can be reduced, and thereby an MRAM of which a write current is sufficiently reduced to less than 1 mA can be provided. In addition to this, in the present invention, by supplying the write current from the magnetization free region to the first magnetization pinned region, and from the magnetization free region to the second magnetization pinned region, first data and second data can be respectively written to the magnetization free region. The writing is performed by completely moving the domain wall away, so that it is not necessary to stop the domain wall at a stable point, and therefore an occurrence probability of a write error can be reduced to an extremely small value. This enables the present invention to provide an MRAM using the current-driven domain wall phenomenon in which a write error is unlikely to occur with a write current and current density being sufficiently reduced.

While the invention has been particularly shown and described with reference to exemplary embodiments (including a plurality of configuration examples and variation examples) thereof, the invention is not limited to these embodiments (including a plurality of configuration examples and variation examples). It will be understood by those of ordinary skill in the art that various changes in form and details may be made therein without departing from the spirit and scope of the present invention as defined by the claims.

The invention claimed is:

1. A magnetic random access memory comprising:
a first ferromagnetic layer;
an insulating layer configured to be provided adjacent to said first ferromagnetic layer; and
a first magnetization pinned layer configured to be provided adjacent to said insulating layer on a side opposite to said first ferromagnetic layer,
wherein said first ferromagnetic layer includes:
a magnetization free region configured to have reversible magnetization, and overlap with said first magnetization pinned layer as a second ferromagnetic layer,
a first magnetization pinned region configured to have first pinned magnetization and be connected to a part of said magnetization free region, and
a second magnetization pinned region configured to have second pinned magnetization and be connected to a part of said magnetization free region,
wherein said first ferromagnetic layer has magnetic anisotropy in a direction perpendicular to a film surface, and
wherein said first pinned magnetization and said second pinned magnetization are pinned antiparallel to each other in said direction perpendicular to said film surface.

2. The magnetic random access memory according to claim 1, wherein said magnetization free region, said first magnetization pinned region, and said second magnetization pinned region are formed in a junction of three roads shape.

3. The magnetic random access memory according to claim 1, further comprising:
a third ferromagnetic layer configured to be provided adjacent to at least a part of said first magnetization pinned region and said second magnetization pinned region.

4. The magnetic random access memory according to claim 3, wherein said third ferromagnetic layer is composed of a material which has magnetic anisotropy in said direction perpendicular to said film surface.

5. The magnetic random access memory according to claim 3, wherein said third ferromagnetic layer is composed of a material which has magnetic anisotropy in a film surface longer side direction.

6. The magnetic random access memory according to claim 1, wherein a width of said magnetization free region narrows toward an end portion of a side opposite to a connection portion to said first magnetization pinned region and said second magnetization pinned region.

7. The magnetic random access memory according to claim 1, wherein said first ferromagnetic layer is provided with a notch.

8. The magnetic random access memory according to claim 1, wherein said first ferromagnetic layer has a modulated cross-section shape.

9. A data write method for a magnetic random access memory, wherein said magnetic random access memory comprises:
a first ferromagnetic layer,
an insulating layer configured to be provided adjacent to said first ferromagnetic layer, and
a first magnetization pinned layer configured to be provided adjacent to said insulating layer on a side opposite to said first ferromagnetic layer,
wherein said first ferromagnetic layer includes:
a magnetization free region configured to have reversible magnetization and overlap with said first magnetization pinned layer as a second ferromagnetic layer,
a first magnetization pinned region configured to have first pinned magnetization and be connected to a part of said magnetization free region, and
a second magnetization pinned region configured to have second pinned magnetization and be connected to a part of said magnetization free region,
wherein said first ferromagnetic layer has magnetic anisotropy in a direction perpendicular to a film surface, and
wherein said first pinned magnetization and said second pinned magnetization are pinned antiparallel to each other in said direction perpendicular to said film surface,
said data write method for a magnetic random access memory comprising:
(A) when writing of first data, supplying a first write current from said magnetization free region to said first magnetization pinned region; and (B) when writing of second data, supplying a second write current from said magnetization free region to said second magnetization pinned region.

10. A magnetoresistance effect element comprising:
a first ferromagnetic layer;
an insulating layer configured to be provided adjacent to said first ferromagnetic layer; and
a first magnetization pinned layer configured to be provided adjacent to said insulating layer on a side opposite to said first ferromagnetic layer,
wherein said first ferromagnetic layer includes:
a magnetization free region configured to have reversible magnetization and overlap with said first magnetization pinned layer as a second ferromagnetic layer,
a first magnetization pinned region configured to have first pinned magnetization and be connected to a part of said magnetization free region, and
a second magnetization pinned region configured to have second pinned magnetization and be connected to a part of said magnetization free region,
wherein said first ferromagnetic layer has magnetic anisotropy in a direction perpendicular to a film surface,
wherein said first fixed magnetization and said second fixed magnetization are pinned antiparallel to each other in said direction perpendicular to said film surface.

11. The magnetoresistance effect element according to claim 10, wherein said magnetization free region, said first magnetization pinned region, and said second magnetization pinned region are formed in a junction of three roads shape.

12. The magnetoresistance effect element according to claim 10, further comprising:
a third ferromagnetic layer configured to be provided adjacent to at least a part of said first magnetization pinned region and said second magnetization pinned region.

13. The magnetoresistance effect element according to claim 12, wherein said third ferromagnetic layer is composed of a material which has magnetic anisotropy in said direction perpendicular to said film surface.

14. The magnetoresistance effect element according to claim 12, wherein said third ferromagnetic layer is composed of a material which has magnetic anisotropy in a film surface longer side direction.

15. The magnetoresistance effect element according to claim 10, wherein a width of said magnetization free region narrows toward an end portion of a side opposite to a connection portion to said first magnetization pinned region and said second magnetization pinned region.

16. The magnetoresistance effect element according to claim 10, wherein said first ferromagnetic layer is provided with a notch.

17. The magnetoresistance effect element according to claim 10, wherein said first ferromagnetic layer has a modulated cross-section shape.

* * * * *